(12) United States Patent
Cha et al.

(10) Patent No.: US 12,027,654 B2
(45) Date of Patent: Jul. 2, 2024

(54) UNIT PIXEL HAVING LIGHT EMITTING DEVICE AND DISPLAYING APPARATUS

(71) Applicant: SEOUL VIOSYS CO., LTD., Gyeonggi-do (KR)

(72) Inventors: Namgoo Cha, Gyeonggi-do (KR); Sangmin Kim, Gyeonggi-do (KR); Yeonkyu Park, Gyeonggi-do (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 337 days.

(21) Appl. No.: 17/470,421

(22) Filed: Sep. 9, 2021

(65) Prior Publication Data

US 2022/0085240 A1   Mar. 17, 2022

Related U.S. Application Data

(60) Provisional application No. 63/077,477, filed on Sep. 11, 2020.

(51) Int. Cl.
*H01L 33/60* (2010.01)
*H01L 25/075* (2006.01)
*H01L 33/10* (2010.01)
*H01L 33/62* (2010.01)

(52) U.S. Cl.
CPC .......... *H01L 33/60* (2013.01); *H01L 25/0753* (2013.01); *H01L 33/10* (2013.01); *H01L 33/62* (2013.01)

(58) Field of Classification Search
None
See application file for complete search history.

(56) References Cited

U.S. PATENT DOCUMENTS

| 2015/0362165 A1* | 12/2015 | Chu | H01L 33/32 362/235 |
| 2019/0229097 A1* | 7/2019 | Takeya | H01L 21/6835 |
| 2020/0251608 A1* | 8/2020 | Cho | H01L 33/0095 |
| 2021/0399041 A1* | 12/2021 | Park | H01L 33/62 |

FOREIGN PATENT DOCUMENTS

| KR | 1020150035211 A | 4/2015 |
| KR | 1020190026617 A | 3/2019 |
| KR | 1020190030482 A | 3/2019 |
| KR | 1020200019133 A | 2/2020 |
| WO | 2019013469 A1 | 1/2019 |

OTHER PUBLICATIONS

International Search Report issued in corresponding International Application No. PCT/KR2021/012382, English Translation, dated Jan. 3, 2022, 2 pages.

* cited by examiner

*Primary Examiner* — Feifei Yeung Lopez
(74) *Attorney, Agent, or Firm* — Perkins Coie LLP

(57) ABSTRACT

A unit pixel includes a transparent substrate having an upper surface and a lower surface, a plurality of light emitting devices arranged over the upper surface of the transparent substrate, and a reflector disposed between the light emitting devices and the transparent substrate. Light emitted from the light emitting devices is configured to exit to the outside through the upper and lower surfaces of the transparent substrate, and the reflector is configured to reflect light proceeding to the upper surface of the transparent substrate from the inside of the transparent substrate.

20 Claims, 18 Drawing Sheets

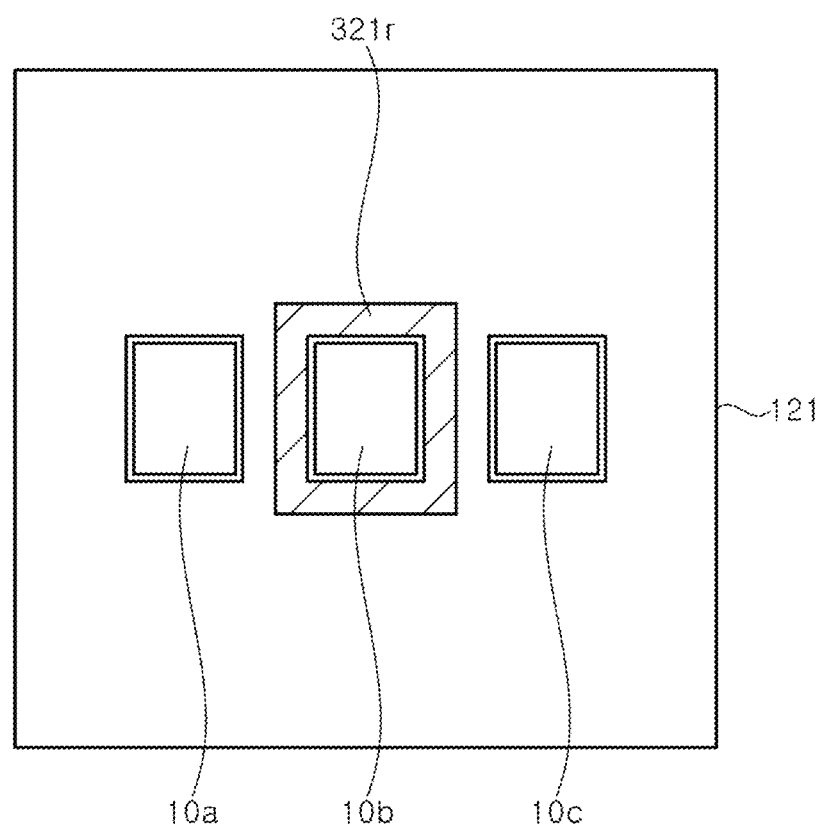

UNIT PIXEL HAVING LIGHT EMITTING DEVICE AND DISPLAYING APPARATUS

CROSS-REFERENCE OF RELATED APPLICATIONS AND PRIORITY

This application is a Nonprovisional application which claims priority to and benefit of U.S. Provisional Application No. 63/077,477, filed Sep. 11, 2020, which is hereby incorporated by reference for all purposes as if fully set forth herein.

TECHNICAL FIELD

Exemplary embodiments relate to a unit pixel having light emitting devices and a displaying apparatus having the same.

BACKGROUND

Light emitting devices are semiconductor devices using light emitting diodes which are inorganic light sources, and are used in various technical fields such as displaying apparatuses, automobile lamps, general lighting, and the like. Light emitting diodes have advantages such as longer lifespan, lower power consumption, and quicker response than conventional light sources, and thus, the light emitting diodes have been replacing the conventional light sources.

The conventional light emitting diodes have been generally used as backlight light sources in displaying apparatuses. However, displaying apparatuses that directly realize images using the light emitting diodes have been recently developed. Such displays are also referred to as micro LED displays.

In general, a displaying apparatus displays various colors through mixture of blue, green, and red light. In order to realize various images, the displaying apparatus includes a plurality of pixels, each including blue, green, and red sub-pixels. As such, a color of a certain pixel is typically determined based on the colors of the sub-pixels, and images can be realized through the combination of such pixels.

In the case of a micro LED display, a micro LED is arranged on a two-dimensional plane corresponding to each sub pixel, and, accordingly, a large number of micro LEDs need to be arranged on a single substrate. However, the micro LED is extremely small, for example, 200 μm or less, further 100 μm or less. In light of small sizes, handling of the light emitting diodes having small sizes, such as directly mounting the light emitting diodes on a display panel, may need to be done with proper techniques.

SUMMARY

Exemplary embodiments provide a unit pixel suitable for being mounted on a circuit board and a displaying apparatus having the same.

Exemplary embodiments provide a unit pixel capable of preventing reduction in luminance and a displaying apparatus having the same.

Exemplary embodiments provide a unit pixel capable of controlling a viewing angle of a micro LED and a displaying apparatus having the same.

An exemplary embodiment provides a unit pixel, including a transparent substrate having an upper surface and a lower surface, a plurality of light emitting devices arranged over the upper surface of the transparent substrate, and a reflector disposed between the light emitting devices and the transparent substrate, in which light emitted from the light emitting devices is configured to exit to the outside through the upper and lower surface of the transparent substrate, and the reflector is configured to reflect light proceeding to the upper surface of the transparent substrate from the inside of the transparent substrate.

An exemplary embodiment provides a displaying apparatus, including a circuit board having pads, a plurality of unit pixels disposed on the circuit board, and bonding materials for bonding the unit pixels to the pads. Each of the unit pixels includes a transparent substrate having an upper surface and a lower surface, a plurality of light emitting devices arranged over the upper surface of the transparent substrate, and a reflector disposed between the light emitting devices and the transparent substrate. Light emitted from the light emitting devices is configured to exit to the outside through the upper and lower surfaces of the transparent substrate, and the reflector is configured to reflect light proceeding to the upper surface of the transparent substrate from the inside of the transparent substrate.

DESCRIPTION OF DRAWINGS

FIG. 5A shows forming a concave-convex pattern on an upper surface of a transparent substrate;

FIG. 5B shows forming a reflector on the transparent substrate;

FIG. 5C shows forming a light blocking layer covering the reflector;

FIG. 5D shows forming an adhesive layer on the light blocking layer;

FIG. 5E shows forming a step adjustment layer to cover light emitting devices; and FIG. 5F shows forming connection layers on the step adjustment layer.

FIGS. 6A through 6F are schematic plan views illustrating various modifications of a unit pixel according to an exemplary embodiment, where:

FIG. 6A shows a reflector disposed around a specific light emitting device;

FIG. 6B shows a reflector disposed around all of light emitting devices;

FIG. 6C shows another reflector disposed around all of light emitting devices;

FIG. 6D shows a reflector disposed so that an outer surface thereof has an elliptical shape;

FIG. 6E shows a reflector disposed around the light emitting devices in an elliptical shape; and FIG. 6F shows a reflector disposed around the light emitting devices.

DETAILED DESCRIPTION OF THE ILLUSTRATED EMBODIMENTS

Figure 1:
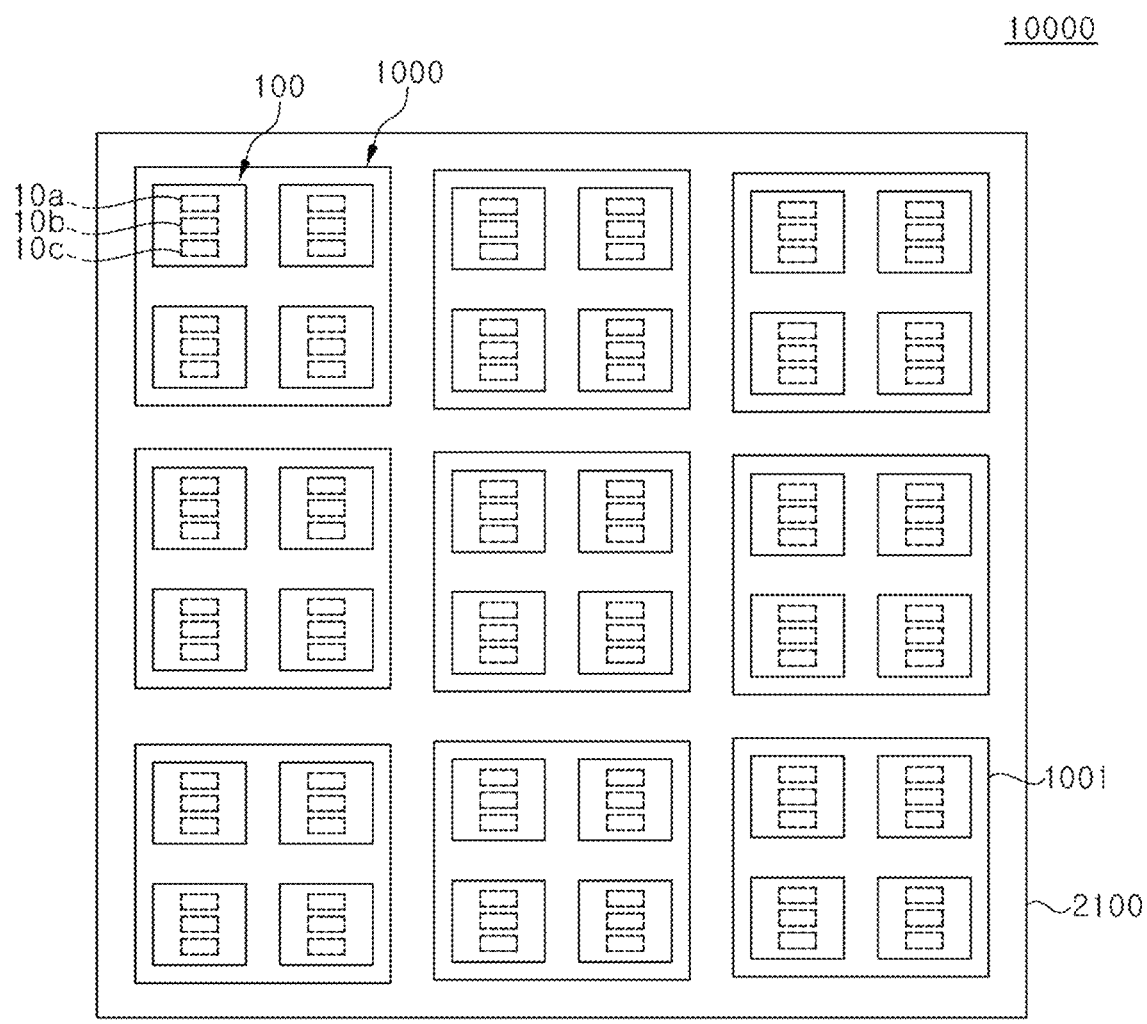
FIG. 1 is a schematic plan view illustrating a displaying apparatus according to an exemplary embodiment.

Hereinafter, embodiments will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

An exemplary embodiment provides a unit pixel, including a transparent substrate having an upper surface and a lower surface, a plurality of light emitting devices arranged over the upper surface of the transparent substrate, and a reflector disposed between the light emitting devices and the transparent substrate. Light emitted from the light emitting devices is configured to exit to the outside through the upper and lower surfaces of the transparent substrate, and the reflector is configured to reflect light proceeding to the upper surface of the transparent substrate from the inside of the transparent substrate.

Since the reflector is employed, luminance and viewing angles of light emitted from the light emitting devices may be increased. Light emitted from the light emitting devices is configured to propagate through the first surface and the second surface of the transparent substrate. The reflector is structured to reflect light propagating via the first surface of the transparent substrate from an inside of the transparent substrate.

In at least one variant, the unit pixel may further include a light blocking layer disposed between the light emitting devices and the transparent substrate, and covering the reflector. The light blocking layer may have windows through which light generated in the light emitting devices pass, and the light emitting devices may be disposed to correspond to the windows.

In another variant, the unit pixel may further include an adhesive layer disposed between the light blocking layer and the light emitting devices, and the light emitting devices may be attached to the adhesive layer.

In further another variant, the unit pixel may further include a surface layer covering a surface of the transparent substrate, and the reflector and the light blocking layer may be located on the surface layer.

In another variant, the surface layer may prevent the reflector and the light blocking layer from being peeled off from the transparent substrate by improving adhesion between the reflector and the light blocking layer.

In another variant, the unit pixel may further include a step adjustment layer covering the light emitting devices; and connection layers disposed on the step adjustment layer, in which the step adjustment layer may have openings exposing the light emitting devices, and the connection layers may be electrically connected to the light emitting devices through the openings of the step adjustment layer.

In another variant, the unit pixel may further include an insulation material layer covering the connection layers, and the insulation material layer may have openings exposing the connection layers.

Furthermore, the insulation material layer may cover side surfaces of the step adjustment layer and side surfaces of the connection layers.

In an exemplary embodiment, the insulation material layer may have a thickness smaller than that of the step adjustment layer.

The step adjustment layer and the insulation material layer may be formed of polyimide.

Each of the light emitting devices includes a light emitting structure including a first conductivity type semiconductor layer, a second conductivity type semiconductor layer, and an active layer interposed between the first and second conductivity type semiconductor layers; and a first electrode pad and a second electrode pad disposed on the light emitting structure, in which the openings of the step adjustment layer may expose the first and second electrode pads.

In at least one variant, each of the light emitting devices may further include an insulation layer disposed between the light emitting structure and the first and second electrode pads, and the insulation layer may include a distributed Bragg reflector.

In another variant, the light emitting devices may include a red light emitting device, a green light emitting device, and a blue light emitting device, and the insulation layer of the blue light emitting device may have a lower reflectance than those of the insulation layers of the red and blue light emitting devices.

In further another variant, the transparent substrate may have a concave-convex pattern on a surface facing the light emitting devices. Viewing angles of light emitted from the light emitting devices may be uniform by the concavo-convex pattern.

Each of the plurality of light emitting devices may have a first concave-convex pattern on a surface facing the transparent substrate and a second concave-convex pattern formed on the first concave-convex pattern. Light extraction efficiency may be improved by the first and second concavo-convex patterns, and the viewing angles of the light emitting devices may become uniform.

The plurality of light emitting devices may include at least three light emitting devices emitting light of different colors from one another, and the at least three light emitting devices may be arranged in a line.

An exemplary embodiment provides a displaying apparatus, including a circuit board having pads; a plurality of unit pixels disposed on the circuit board, and bonding materials for bonding the unit pixels to the pads. Each of the unit pixels includes a transparent substrate having an upper surface and a lower surface, a plurality of light emitting devices arranged over the upper surface of the transparent substrate, and a reflector disposed between the light emitting devices and the transparent substrate. Light emitted from the light emitting devices is configured to exit to the outside through the upper and lower surfaces of the transparent substrate, and the reflector is configured to reflect light proceeding to the upper surface of the transparent substrate from the inside of the transparent substrate.

In another variant, the unit pixel may further include a light blocking layer disposed between the light emitting devices and the transparent substrate, and covering the reflector, in which the light blocking layer may have windows through which light generated in the light emitting devices pass, and the light emitting devices may be disposed to correspond to the windows.

In further another variant, the unit pixel may further include a step adjustment layer covering the light emitting devices; and connection layers disposed on the step adjustment layer, in which the step adjustment layer may have openings exposing the light emitting devices, and the connection layers may be electrically connected to the light emitting devices through the openings of the step adjustment layer.

In another variant, the bonding materials may bond the connection layers and the pads.

According to one or more embodiments of the present disclosure, a displaying apparatus includes a circuit board having pads, a plurality of unit pixels disposed on the circuit board, and bonding materials for bonding the unit pixels to the pads. Each of the unit pixels includes a transparent substrate having a first surface and a second surface, a plurality of light emitting devices arranged over the first surface of the transparent substrate, and a reflector disposed between the light emitting devices and the transparent substrate. Light emitted from the light emitting devices propagates through the first surface and the second surface of the transparent substrate. The reflector is structured to reflect light propagating via the first surface of the transparent substrate from an inside of the transparent substrate.

Hereinafter, exemplary embodiments of the present disclosure will be described in detail with reference to the accompanying drawings.

FIG. 1 is a schematic plan view illustrating a displaying apparatus according to an exemplary embodiment.

According to FIG. 1, a displaying apparatus 10000 may include a panel substrate 2100 and a plurality of pixel modules 1000.

The displaying apparatus 10000 is not particularly limited, but may include a VR displaying apparatus such as a micro LED TV, a smart watch, a VR headset, or an AR displaying apparatus such as augmented reality glasses.

The panel substrate 2100 may include a circuit for passive matrix driving or active matrix driving. In an exemplary embodiment, the panel substrate 2100 may include interconnection lines and resistors therein, and in another exemplary embodiment, the panel substrate 2100 may include interconnection lines, transistors, and capacitors. The panel substrate 2100 may also have pads that are capable of being electrically connected to the disposed circuit on an upper surface thereof.

In an exemplary embodiment, the plurality of pixel modules 1000 is arranged on the panel substrate 2100. Each of the pixel modules 1000 may include a circuit board 1001 and a plurality of unit pixels 100 disposed on the circuit board 1001. In another exemplary embodiment, the plurality of unit pixels 100 may be directly arranged on the panel substrate 2100.

In some forms, each of the unit pixels 100 includes a plurality of light emitting devices 10a, 10b, and 10c. The light emitting devices 10a, 10b, and 10c may emit light of different colors from one another. The light emitting devices 10a, 10b, and 10c in each of the unit pixels 100 may be arranged in a line as illustrated in FIG. 1. In an exemplary embodiment, the light emitting devices 10a, 10b, and 10c may be arranged in the vertical direction with respect to a display screen on which an image is implemented. However, the inventive concepts are not limited thereto, and the light emitting devices 10a, 10b, and 10c may be arranged in a lateral direction with respect to the display screen on which the image is implemented.

Hereinafter, each element of the displaying apparatus 10000 will be described in detail in the order of the light emitting devices 10a, 10b, and 10c, the unit pixel 100, and the pixel module 1000 that are disposed in the displaying apparatus 10000.

Figure 2A:
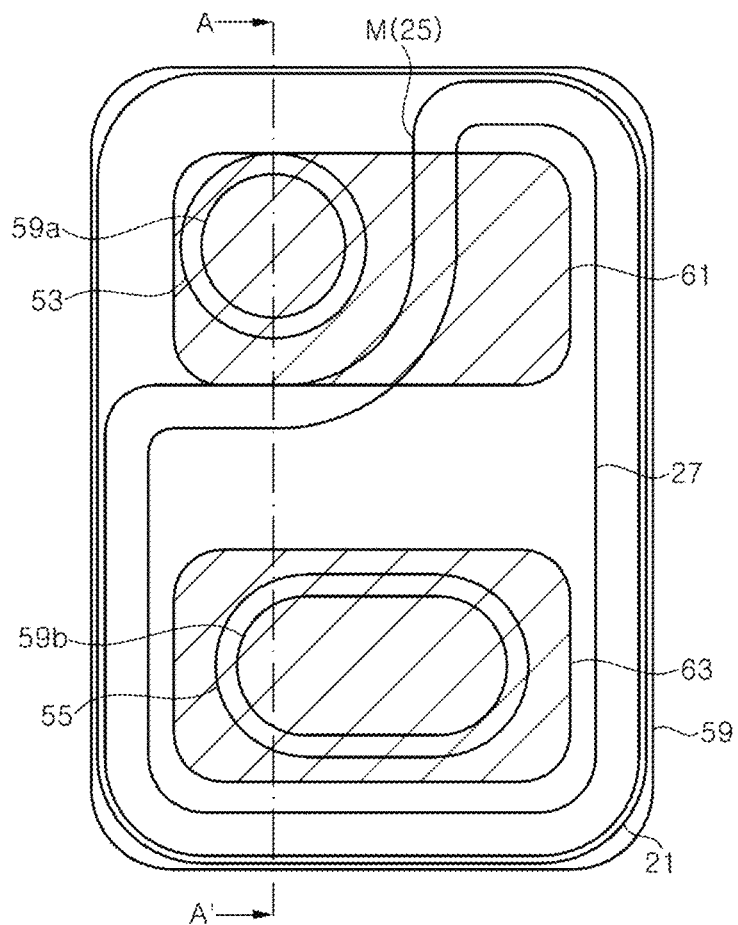
FIG. 2A is a schematic plan view illustrating a light emitting device according to an exemplary embodiment.
Figure 2B:
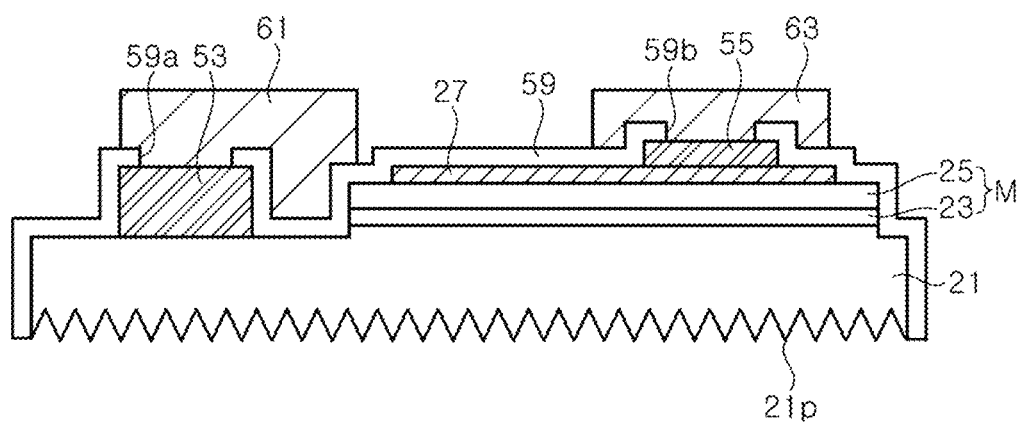
FIG. 2B is a schematic cross-sectional view taken along line A-A' of FIG. 2A.

First, FIG. 2A is a schematic plan view illustrating the light emitting device 10a according to an exemplary embodiment, and FIG. 2B is a schematic cross-sectional view taken along line A-A of FIG. 2A. Herein, although the light emitting device 10a will be described as an example, since the light emitting devices 10b and 10c have substantially similar structures, repeated descriptions thereof will be omitted.

Referring to FIG. 2A and FIG. 2B, the light emitting device 10a includes a light emitting structure including a first conductivity type semiconductor layer 21, an active layer 23, and a second conductivity type semiconductor layer 25, an ohmic contact layer 27, a first contact pad 53, a second contact pad 63.

The light emitting structure, that is, the first conductivity type semiconductor layer 21, the active layer 23, and the second conductivity type semiconductor layer 25 may be grown on a substrate. The substrate may be one of various substrates that are used to grow semiconductors, such as a gallium nitride substrate, a GaAs substrate, a Si substrate, a sapphire substrate, especially a patterned sapphire substrate. The growth substrate may be separated from the semiconductor layers using a process such as a mechanical grinding, a laser lift off, a chemical lift off process, or the like. However, the inventive concepts are not limited thereto, and, in some exemplary embodiments, a portion of the substrate may remain to constitute at least a portion of the first conductivity type semiconductor layer 21.

When the light emitting device 10a emits red light according to an exemplary embodiment, the semiconductor layers may include aluminum gallium arsenide (AlGaAs), gallium arsenide phosphide (GaAsP), aluminum gallium indium phosphide (AlGaInP), or gallium phosphide (GaP).

When the light emitting device 10b emits green light, the semiconductor layers may include indium gallium nitride (InGaN), gallium nitride (GaN), gallium phosphide (GaP), aluminum gallium indium phosphide (AlGaInP), or aluminum gallium phosphide (AlGaP).

When the light emitting device 10c emits blue light according to an exemplary embodiment, the semiconductor layers may include gallium nitride (GaN), indium gallium nitride (InGaN), or zinc selenide (ZnSe).

The first conductivity type and the second conductivity type have opposite polarities, such as when the first conductivity type is an n-type, the second conductivity type becomes a p-type, or, when the first conductivity type is a p-type, the second conductivity type becomes an n-type.

The first conductivity type semiconductor layer 21, the active layer 23, and the second conductivity type semiconductor layer 25 may be grown on the substrate in a chamber using a known process such as Metal Organic Chemical Vapor Deposition (MOCVD) process. In addition, the first conductivity type semiconductor layer 21 includes n-type impurities (e.g., Si, Ge, and Sn), and the second conductivity type semiconductor layer 25 includes p-type impurities (e.g., Mg, Sr, and Ba). In an exemplary embodiment, the first conductivity type semiconductor layer 21 may include GaN or AlGaN containing Si as a dopant, and the second conductivity type semiconductor layer 25 may include GaN or AlGaN containing Mg as a dopant.

Although the first conductivity type semiconductor layer 21 and the second conductivity type semiconductor layer 25 are shown as a single layer in FIGS. 2A-2B, respectively, these layers may be multiple layers, and may also include a superlattice layer. The active layer 23 may include a single quantum well structure or a multiple quantum well structure, and a composition ratio of a nitride-based semiconductor may be adjusted to emit a desired wavelength. For example, the active layer 23 may emit blue light, green light, red light, or ultraviolet light.

The second conductivity type semiconductor layer 25 and the active layer 23 may have a mesa M structure and may be disposed on the first conductivity type semiconductor layer 21. The mesa M may include the second conductivity type semiconductor layer 25 and the active layer 23, and may include a portion of the first conductivity type semiconductor layer 21 as illustrated in FIG. 2B. The mesa M may be disposed on the portion of the first conductivity type semiconductor layer 21, and an upper surface of the first conductivity type semiconductor layer 21 may be exposed around the mesa M.

In the illustrated exemplary embodiment, the mesa M is formed so as to expose the first conductivity type semiconductor layer 21 around it. In another exemplary embodiment, a through hole may be formed through the mesa M to expose the first conductivity type semiconductor layer 21.

Meanwhile, the first conductivity type semiconductor layer 21 may have a concave-convex pattern 21p through surface texturing. The concave-convex pattern 21p may be formed on a light exiting surface of the first conductivity type semiconductor layer 21. Surface texturing may be carried out, for example, through patterning using a dry or wet etching process.

In an exemplary embodiment, cone-shaped protrusions may be formed on the light exiting surface of the first conductivity type semiconductor layer 21, a height of the cone may be about 2 μm to about 3 μm, a distance between the cones may be about 1.5 μm to about 2 μm, and a diameter of a bottom of the cone may be about 3 μm to about 5 μm. The cone may also be truncated, in which an upper diameter of the cone may be about 2 μm to about 3 μm.

Figure 2C:
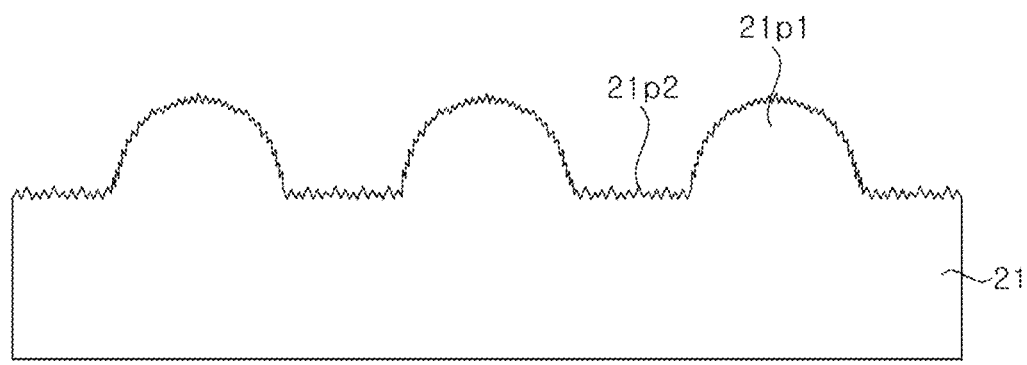
FIG. 2C is a schematic cross-sectional view illustrating a surface concave-convex pattern of a light emitting device according to an exemplary embodiment.
Figure 2D:
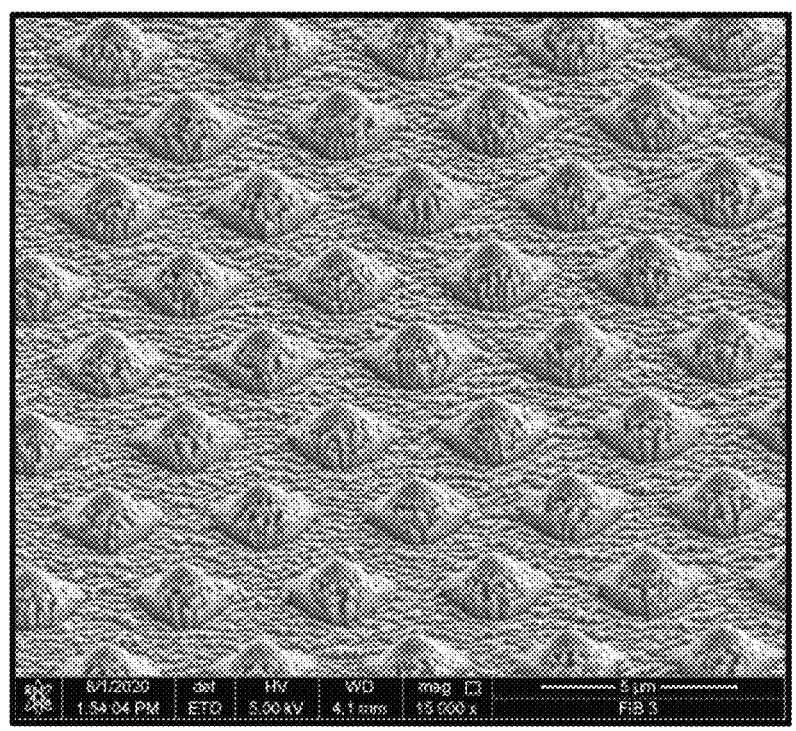
FIG. 2D is an SEM image illustrating the surface concave-convex pattern of the light emitting device according to an exemplary embodiment.

In another exemplary embodiment, the concave-convex pattern 21p, as shown in FIG. 2C, may include a first concave-convex pattern 21p1 and a second concave-convex pattern 21p2 additionally formed on the first concave-convex pattern 21p. Protrusions of the first concave-convex pattern 21p1 may have a height of about 2 μm to about 3 μm, an interval of about 1.5 μm to about 2 μm, and a bottom diameter of about 3 μm to about 5 μm. Meanwhile, the second concave-convex pattern 21p2 may be formed both in the protrusions of the first concave-convex pattern 21p1 and in a region between the protrusions. FIG. 2D shows an SEM image illustrating an SEM photograph of a concavo-convex pattern actually formed on a surface of the first conductivity type semiconductor layer 21. The first concave-convex pattern 21p1 may be formed using a dry or wet etching technique, and the second concave-convex pattern 21p2 may be formed using, for example, a wet etching technique.

Since the concave-convex pattern 21p is formed on the surface of the first conductivity type semiconductor layer 21, total internal reflection may be reduced, thereby increasing light extraction efficiency. Surface texturing may be carried out on the first conductivity type semiconductor layers of all of the first, second, and third light emitting devices 10a, 10b, and 10c, and thus, viewing angles of light emitted from the first, second, and third light emitting devices 10a, 10b, and 10c may become uniform. However, the inventive concepts are not limited thereto, and at least one of the light emitting devices may have a flat surface without including the concave-convex pattern 21p.

Referring back to FIGS. 2A and 2B, the ohmic contact layer 27 is disposed on the second conductivity type semiconductor layer 25 to be in ohmic contact with the second conductivity type semiconductor layer 25. The ohmic contact layer 27 may be formed of a single layer or multiple layers, and may be formed of a transparent conductive oxide film or a metal film. For example, the transparent conductive oxide film may include ITO, ZnO, or the like, and the metal film may include a metal such as Al, Ti, Cr, Ni, Au, or the like and alloys thereof.

The first contact pad 53 is disposed on the exposed first conductivity type semiconductor layer 21. The first contact pad 53 may be in ohmic contact with the first conductivity type semiconductor layer 21. For example, the first contact pad 53 may be formed of an ohmic metal layer in ohmic contact with the first conductivity type semiconductor layer 21. The ohmic metal layer of the first contact pad 53 may be appropriately selected depending on a semiconductor material of the first conductivity type semiconductor layer 21. Alternatively, the first contact pad 53 may be omitted.

The second contact pad 55 may be disposed on the ohmic contact layer 27. The second contact pad 55 is electrically connected to the ohmic contact layer 27. The second contact pad 55 may be omitted.

The insulation layer 59 covers the mesa M, the ohmic contact layer 27, the first contact pad 53, and the second contact pad 55. The insulation layer 59 has openings 59a and 59b exposing the first contact pad 53 and the second contact pad 55. The insulation layer 59 may be formed as a single layer or multiple layers. Furthermore, the insulation layer 59 may include a distributed Bragg reflector in which insulation layers having different refractive indices from one another are stacked. For example, the distributed Bragg reflector may include at least two types of insulation layers selected from $SiO_2$, $Si_3N_4$, $SiON$, $TiO_2$, $Ta_2O_5$, and $Nb_2O_5$.

The distributed Bragg reflector reflects light emitted from the active layer 23. The distributed Bragg reflector may exhibit high reflectance over a relatively wide wavelength range including a peak wavelength of light emitted from the active layer 23, and may be designed in consideration of an incident angle of light. In an exemplary embodiment, the distributed Bragg reflector may have a higher reflectance for light incident at an incident angle of 0 degrees than that for light incident at a different incident angle. In another exemplary embodiment, the distributed Bragg reflector may have a higher reflectance for light incident at a particular incident angle than that for light incident at the incident angle of 0 degrees. For example, the distributed Bragg reflector may have a higher reflectance for light incident at an incident angle of 10 degrees than thar for light incident at the incident angle of 0 degrees.

Meanwhile, the light emitting structure of the blue light emitting device 10c has higher internal quantum efficiency compared to those of the light emitting structures of the red light emitting device 10a and the green light emitting device 10b. Accordingly, the blue light emitting device 10c may exhibit higher light extraction efficiency than those of the red and green light emitting devices 10a and 10b. As such, it may be difficult to properly maintain a color mixing ratio of red light, green light, and blue light.

To adjust the color mixing ratio of red light, green light, and blue light, the distributed Bragg reflectors applied to the light emitting devices 10a, 10b, and 10c may be formed to have different reflectances from one another. For example, the blue light emitting device 10c may have the distributed Bragg reflector having a relatively low reflectance compared to those of the red and green light emitting devices 10a and 10b. For example, the distributed Bragg reflector formed in the blue light emitting device 10c may have a reflectance of 95% or less at the incident angle of 0 degrees for blue light generated in the active layer 23, and further 90% or less, the distributed Bragg reflector formed in the green light emitting device 10b may have a reflectance of about 95% or more and 99% or less at the incident angle of 0 degrees for green light, and the distributed Bragg reflector formed in the red light emitting device 10a may have a reflectance of 99% or more at the incident angle of 0 degrees for red light.

In an exemplary embodiment, the distributed Bragg reflectors applied to the red, green, and blue light emitting devices 10a, 10b, and 10c may have a substantially similar thickness. For example, a difference in thickness between the distributed Bragg reflectors applied to these light emitting devices 10a, 10b, and 10c may be 10% or less of a thickness of a thickest distributed Bragg reflector. By reducing the thickness difference between the distributed Bragg reflectors, process conditions applied to the red, green, and blue light emitting devices 10a, 10b, and 10c, for example, a process of patterning the insulation layer 59, may be similarly set, and furthermore, it is possible to prevent the unit pixel manufacturing process from becoming complex. Moreover, the distributed Bragg reflectors applied to the red, green, and blue light emitting devices 10a, 10b, and 10c may have a substantially similar stacking number. However, the inventive concepts are not limited thereto.

The first electrode pad 61 and the second electrode pad 63 are disposed on the insulation layer 59. The first electrode pad 61 may extend from an upper region of the first contact pad 53 to an upper region of the mesa M, and the second pad 63 may be disposed in the upper region of the mesa M. The first electrode pad 61 may be connected to the first contact pad 53 through the opening 59a, and the second electrode pad 63 may be electrically connected to the second contact pad 55. The first electrode pad 61 may be directly in ohmic contact with the first conductivity type semiconductor layer 21, and in this case, the first contact pad 53 may be omitted. In addition, when the second contact pad 55 is omitted, the second electrode pad 63 may be directly connected to the ohmic contact layer 27.

The first and/or second electrode pads 61 and 63 may be formed of a single layer or a multiple layer of metal. As a material of the first and/or second electrode pads 61 and 63, a metal such as Al, Ti, Cr, Ni, Au, or the like and an alloy thereof or the like may be used.

Although the light emitting device 10a according to the exemplary embodiment has been briefly described with reference to FIGS. 2A-2B, the light emitting device 10a may further include a layer having additional functions in addition to the above-described layers. For example, various layers such as a reflection layer for reflecting light, an additional insulation layer for insulating a specific element, and/or a solder preventing layer for preventing diffusion of solder may be further included.

When a flip chip type light emitting device is formed, the mesa may be formed to have various shapes, and locations and shapes of the first and second electrode pads 61 and 63 may also be variously modified, and the second contact pad 55 or the second electrode pad 63 may directly contact the second conductivity type semiconductor layer 25.

Figure 3A:
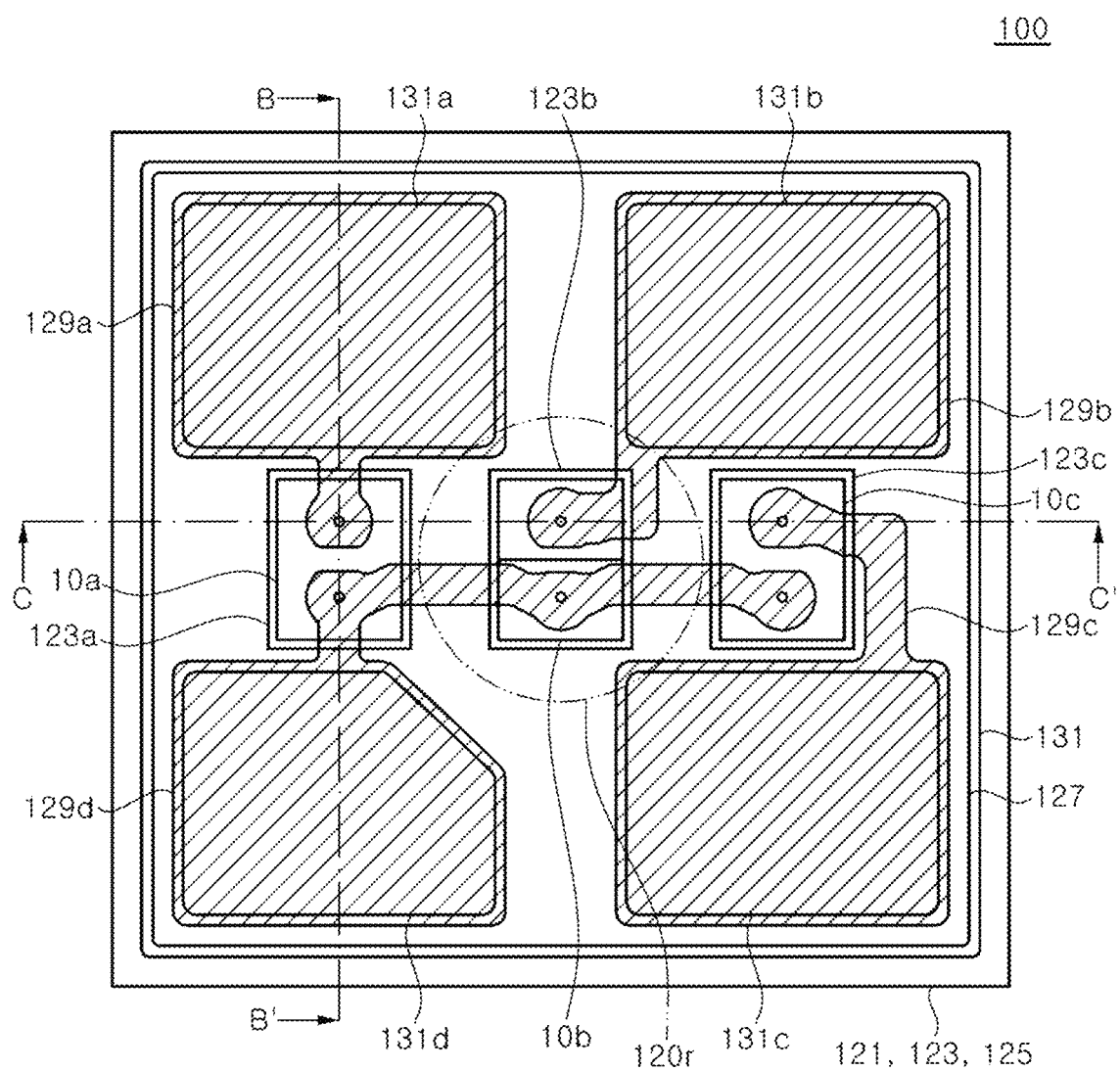
FIG. 3A is a schematic plan view illustrating a unit pixel according to an exemplary embodiment.
Figure 3B:
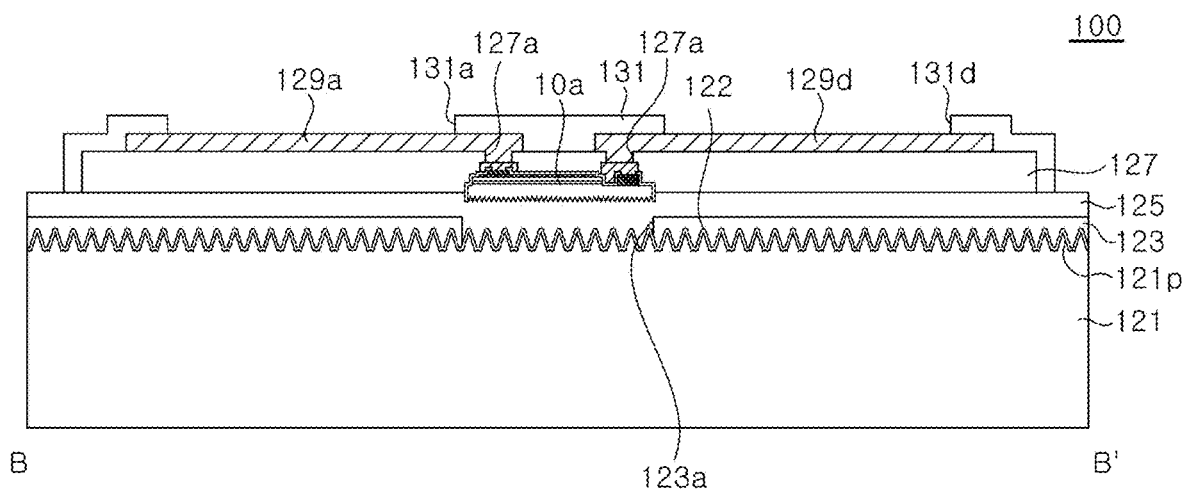
FIG. 3B is a schematic cross-sectional view taken along line B-B' of FIG. 3A.
Figure 3C:
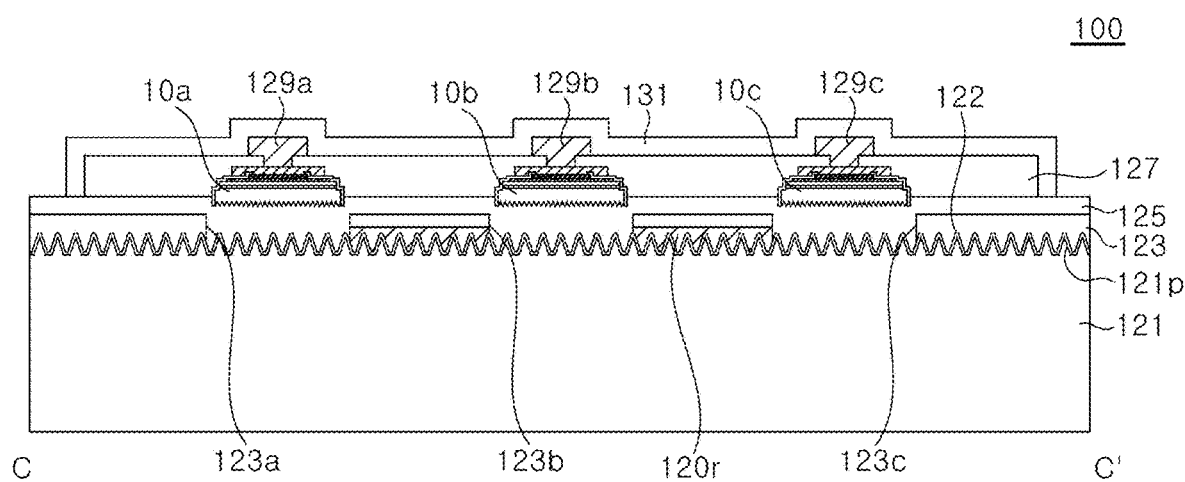
FIG. 3C is a schematic cross-sectional view taken along line C-C' of FIG. 3A.

FIG. 3A is a schematic plan view illustrating a unit pixel 100 according to an exemplary embodiment, FIG. 3B is a schematic cross-sectional view taken along line B-B' of FIG. 3A, and FIG. 3C is a schematic cross-sectional view taken along line C-C' of FIG. 3A.

Referring to FIG. 3A, FIG. 3B, and FIG. 3C, the unit pixel 100 may include a transparent substrate 121, a first, a second, and a third light emitting devices 10a, 10b, and 10c, a surface layer 122, a reflector 120r, a light blocking layer 123, an adhesive layer 125, a step adjustment layer 127, connection layers 129a, 129b, 129c, and 129d, and an insulation material layer 131.

The unit pixel 100 provides a single pixel including the first, second, and third light emitting devices 10a, 10b, and 10c. The first, second, and third light emitting devices 10a, 10b, and 10c emit light of different colors, and the first, second, and third light emitting devices 10a, 10b, and 10c correspond to subpixels, respectively.

The transparent substrate 121 is a light transmissive substrate such as PET, glass substrate, quartz, sapphire substrate, or the like. The transparent substrate 121 is disposed on a light exiting surface of the displaying apparatus 10000 of FIG. 1, and light emitted from the light emitting devices 10a, 10b, and 10c is emitted to the outside through the transparent substrate 121. The transparent substrate 121 may have an upper surface and a lower surface. The transparent substrate 121 may include a concave-convex pattern 121p on a surface facing the light emitting devices 10a, 10b, and 10c, that is, the upper surface. The concave-convex pattern 121p scatters light emitted from the light emitting devices 10a, 10b, and 10c to increase viewing angles. In addition, light emitted from the light emitting devices 10a, 10b, and 10c having different viewing angle characteristics from one another may be emitted at a uniform viewing angle by the concave-convex pattern 121p. As such, it is possible to prevent an occurrence of color difference depending on the viewing angle.

The concavo-convex pattern 121p may be regular or irregular. The concavo-convex pattern 121P may have a pitch of about 3 μm, a diameter of about 2.8 μm, and a height of about 1.8 μm, for example. The concavo-convex pattern 121p may be a pattern generally applied to a patterned sapphire substrate, but the inventive concepts are not limited thereto.

The transparent substrate 121 may further include an anti-reflection coating on a lower surface thereof, may include an anti-glare layer, or may be treated with an anti-glare treatment. The transparent substrate 121 may have a thickness of about 50 μm to about 300 μm for example.

Since the transparent substrate 121 is disposed on the light exiting surface, the transparent substrate 121 does not include a circuit. However, the inventive concepts are not limited thereto, and, in some exemplary embodiments, the transparent substrate 121 may include the circuit.

Although a single unit pixel 100 is illustrated to be formed on a single transparent substrate 121, a plurality of unit pixels 100 may be formed on the single transparent substrate 121.

The surface layer 122 covers the concave-convex pattern 121p of the transparent substrate 121. The surface layer 122 may be formed along a shape of the concave-convex pattern 121p. The surface layer 122 may improve adhesion of the light blocking layer 123 and the reflector 120r formed thereon (shown in FIG. 3C). For example, the surface layer 122 may be formed of a silicon oxide film. In other forms, the surface layer 122 may be omitted depending on a type of the transparent substrate 121.

The light blocking layer 123 is formed on the upper surface of the transparent substrate 121. The light blocking layer 123 may contact the surface layer 122. The light blocking layer 123 may include an absorbing material which absorbs light such as carbon black. The light absorbing material may prevent light generated in the light emitting devices 10a, 10b, and 10c from leaking from a region between the transparent substrate 121 and the light emitting devices 10a, 10b, and 10c toward a side surface thereof, and may prevent light generated in the light emitting devices 10a, 10b, and 10c from being mixed to improve contrast of the displaying apparatus.

The light blocking layer 123 may have windows 123a, 123b, and 123c for a light path, so that light generated in the light emitting devices 10a, 10b, and 10c is incident on the transparent substrate 121, and for this purpose, the light blocking layer 123 may be patterned to expose the transparent substrate 121 on the transparent substrate 121. Widths of the windows 123a, 123b, and 123c may be narrower than those of the light emitting devices, but the inventive concepts are not limited thereto, and may be greater than or equal to those of the light emitting devices.

The window 123a of the light blocking layer 123 also defines locations for arranging the light emitting devices 10a, 10b, and 10c. Accordingly, separate arrangement markers for defining the locations for arranging the light emitting devices 10a, 10b, and 10c may be omitted. However, the inventive concepts are not limited thereto, and arrangement markers may be provided on the transparent substrate 121 or on the light blocking layer 123 or the adhesive layer 125 to provide locations for arranging the light emitting devices 10a, 10b, and 10c.

The reflector 120r may be formed in a partial region on the upper surface of the transparent substrate 121. The reflector 120r may be disposed between the light blocking layer 123 and the transparent substrate 121. The reflector 120r reflects light incident to the light blocking layer 123 between the upper and lower surfaces of the transparent substrate 121. As illustrated, the reflector 120r may be disposed around the light emitting device 10b and around the window 123b. The reflector 120r may be formed of, for example, a reflective metal layer having a reflectance of 80% or more with respect to light emitted from the light emitting device 10b. The reflective metal layer may include, for example, Au, Ag, Al, Pt, Ni, or the like.

In the present embodiment, the light emitting device 10b may be disposed not to overlap with the reflector 120r. However, the present disclosure is not limited thereto, and the light emitting device 10b may be disposed to partially overlap with the reflector 120r.

An outer side surface of the reflector 120r may be circular as indicated by a dotted line in FIG. 3A, but the inventive concepts are not limited thereto. The reflector 120r may have various shapes, which will be described in detail later with reference to FIGS. 6A through 6F.

The adhesive layer 125 is attached onto the transparent substrate 121. The adhesive layer 125 may cover the light blocking layer 123. The adhesive layer 125 may be attached onto an entire surface of the transparent substrate 121, but the inventive concepts are not limited thereto, and, in some exemplary embodiments, the adhesive layer 125 may be attached to a portion of the transparent substrate 121 to expose a region near an edge of the transparent substrate 121. The adhesive layer 125 is used to attach the light emitting devices 10a, 10b, and 10c to the transparent substrate 121. The adhesive layer 125 may fill the window 123a formed in the light blocking layer 123.

The adhesive layer 125 may be formed as a light-transmitting layer, and transmits light emitted from the light emitting devices 10a, 10b, and 10c. The adhesive layer 125 may be formed using an organic adhesive. For example, the adhesive layer 125 may be formed using a transparent epoxy. In addition, the adhesive layer 125 may include a diffuser such as $SiO_2$, $TiO_2$, ZnO, or the like to diffuse light. The light diffusing material prevents the light emitting devices 10a, 10b, and 10c from being observed from the light exiting surface.

Meanwhile, the first, second, and third light emitting devices 10a, 10b, and 10c are disposed on the transparent substrate 121. The first, second, and third light emitting devices 10a, 10b, and 10c may be attached to the transparent substrate 121 by the adhesive layer 125. The first, second, and third light emitting devices 10a, 10b, and 10c may be disposed to correspond to the windows 123a, 123b, and 123c of the light blocking layer 123. When the light blocking layer 123 is omitted, arrangement markers may be added to provide locations for arranging the light emitting devices 10a, 10b, and 10c.

The first, second, and third light emitting devices 10a, 10b, and 10c may be, for example, a red light emitting device, a green light emitting device, and a blue light emitting device. Since specific configurations of each of the first, second, and third light emitting devices 10a, 10b, and 10c are the same as those described with reference to FIG. 2A and FIG. 2B, detailed descriptions thereof will be omitted.

The first, second, and third light emitting devices 10a, 10b, and 10c may be arranged side by side in a line, as illustrated in FIG. 3A. In particular, in a case that the transparent substrate 121 is a sapphire substrate, the sapphire substrate may include clean-cut surfaces (e.g., m-plane) and non-clean-cut surfaces (e.g., a-plane) due to a location of a crystal plane along a cutting direction. For example, when the sapphire substrate is cut into a quadrangular shape, two cutting planes on both sides thereof (e.g., m-plane) may be cut cleanly along the crystal plane, and two remaining cutting planes (e.g., a-plane) disposed in a direction perpendicular to the cutting planes may not be cut cleanly. In this case, the clean-cut surfaces of the sapphire substrate 121 may be flush with an arrangement direction of the light emitting devices 10a, 10b, and 10c. For example, in FIG. 3A, the clean-cut surfaces (e.g., m-plane) may be disposed up and down, and the two remaining cut surfaces (e.g., a-plane) may be disposed left and right.

The first, second, and third light emitting devices 10a, 10b, and 10c may be those described above with reference to FIG. 2A and FIG. 2B, but the inventive concepts are not limited thereto, and various light emitting devices having a lateral or flip chip structure may be used.

The step adjustment layer 127 covers the first, second, and third light emitting devices 10a, 10b, and 10c. The step adjustment layer 127 has openings 127a exposing the first and second electrode pads 61 and 63 of the light emitting devices 10a, 10b, and 10c. The step adjustment layer 127 assists to safely form the connection layers by uniformly adjusting elevations of surfaces on which the connection layers 129a, 129b, 129c, and 129d are formed. The step adjustment layer 127 may be formed of, for example, photosensitive polyimide.

The step adjustment layer 127 may be disposed in a region surrounded by an edge of the adhesive layer 125, but the inventive concepts are not limited thereto. For example, the step adjustment layer 127 may be formed to partially expose the edge of the adhesive layer 125.

The first, second, third, and fourth connection layers 129a, 129b, 129c, and 129d are formed on the step adjustment layer 127. The connection layers 129a, 129b, 129c, and 129d may be connected to the first and second electrode pads 61 and 63 of the first, second, and third light emitting devices 10a, 10b, and 10c through the openings 127a of the step adjustment layer 127.

In an exemplary embodiment, as illustrated in FIG. 3A and FIG. 3B, the first connection layer 129a may be electrically connected to a second conductivity type semiconductor layer of the first light emitting device 10a, the second connection layer 129b may be electrically connected to a second conductivity of the second light emitting device 10b, the third connection layer 129c may be electrically connected to a second conductivity type semiconductor layer of the third light emitting device 10c, and the fourth connection layer 129d may be commonly electrically connected to first conductivity type semiconductor layers of the first, second, and third light emitting devices 10a, 10b, and 10c. The first, second, third, and fourth connection layers 129a, 129b, 129c, and 129d may be formed together on the step adjustment layer 127, and may include a single layer or a multiple layer. For example, the first, second, third, and fourth connection layers 129a, 129b, 129c, and 129d may include at least one of Cr, Ti, Ni, Cu, Al, Pt, or Au. The first, second, third, and fourth connection layers 129a, 129b, 129c, and 129d may include, for example, an adhesive metallic layer, a barrier layer for preventing diffusion of metallic materials, and a bonding metal layer. Additionally, a reflective metallic layer may be disposed between the adhesive metallic layer and the barrier layer. For example, the adhesive metallic layer may include Cr, and the reflective metallic layer may include Al or Ag, the barrier layer may include Ni, and the bonding metal layer may include Au.

In another exemplary embodiment, the first connection layer 129a may be electrically connected to the first conductivity type semiconductor layer of the first light emitting device 10a, the second connection layer 129b may be electrically connected to the first conductivity type semiconductor layer of the second light emitting device 10b, the third connection layer 129c may be electrically connected to the first conductivity type semiconductor layer of the third light emitting device 10c, and the fourth connection layer 129d may be commonly electrically connected to the second conductivity type semiconductor layers of the first, second, and third light emitting devices 10a, 10b, and 10c. The first, second, third, and fourth connection layers 129a, 129b, 129c, and 129d may be formed together on the step adjustment layer 127.

The insulation material layer 131 may be formed to have a thickness smaller than that of the step adjustment layer 127. A sum of the thicknesses of the insulation material layer 131 and the step adjustment layer 127 may be about 1 μm or more and 50 μm or less, but the inventive concepts are not limited thereto.

The insulation material layer 131 covers side surfaces of the step adjustment layer 127 and the connection layers 129a, 129b, 129c, and 129d. In addition, the insulation material layer 131 may cover a portion of the adhesive layer 125. The insulation material layer 131 may have openings 131a, 131b, 131c, and 131d exposing the connection layers 129a, 129b, 129c, and 129d, and accordingly, pad regions of the unit pixel 100 may be defined.

In an exemplary embodiment, the insulation material layer 131 may be a translucent material, and may be formed of an organic or inorganic material. The insulation material layer 131 may be formed of, for example, polyimide. When the insulation material layer 131 along with the step adjustment layer 127 is formed of polyimide, all of lower, side, and upper surfaces of the connection layers 129a, 129b, 129c, and 129d may be surrounded by the polyimide, except for the pad regions.

Meanwhile, the unit pixel 100 may be mounted on a circuit board using a bonding material such as solder, and the bonding material may bond the connection layers 129a, 129b, 129c, and 129d exposed to the openings 131a, 131b, 131c, and 131d of the insulation material layer 131 to pads on the circuit board.

According to the illustrated exemplary embodiment, the unit pixel 100 does not include separate bumps, and the connection layers 129a, 129b, 129c, and 129d are used as bonding pads. However, the inventive concepts are not limited thereto, and bonding pads covering the openings 131a, 131b, 131c, and 131d of the insulation material layer 131 may be further formed. In an exemplary embodiment, the bonding pads may be formed to partially cover the light emitting devices 10a, 10b, and 10c outside of upper regions of the first, second, third, and fourth connection layers 129a, 129b, 129c, and 129d.

In the illustrated exemplary embodiment, it has been described that the light emitting devices 10a, 10b, and 10c are attached to the transparent substrate 121 by the adhesive layer 125, but the light emitting devices 10a, 10b, and 10c may be coupled to the transparent substrate 121 using other couplers instead of the adhesive layer 125. For example, the light emitting devices 10a, 10b, and 10c may be coupled to the transparent substrate 121 using spacers, and thus, gas or liquid may be filled in a region between the light emitting devices 10a, 10b, and 10c and the transparent substrate 121. An optical layer that transmits light emitted from the light emitting devices 10a, 10b, and 10c may be formed by the gas or liquid. The adhesive layer 125 described above is also an example of an optical layer. Herein, the optical layer is formed of a material different from those of the light emitting devices 10a, 10b, and 10c, such as gas, liquid, or solid, and thus, the material of the optical layer is distinct from those of the semiconductor layers in the light emitting devices 10a, 10b, and 10c.

According to the illustrated exemplary embodiment, the reflector 120r is disposed between the light blocking layer 123 and the transparent substrate 121, and may increase luminance of the unit pixel 100 by reflecting light incident on the upper surface of the transparent substrate 121 in the transparent substrate 121. In addition, since the reflector 120r is employed, viewing angles of light emitted from the light emitting devices 10a, 10b, and 10c may be increased. The reflector 120r may be modified in various forms so as to adjust the luminance and the viewing angles of light emitted from the light emitting devices 10a, 10b, and 10c.

Figure 3D:
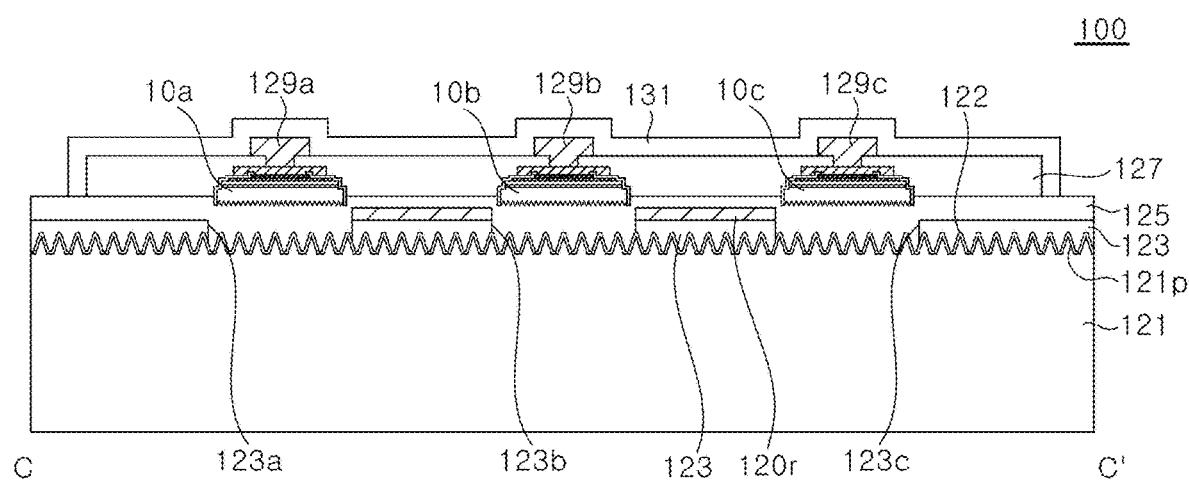
FIG. 3D is a schematic cross-sectional view for illustrating a modification of the unit pixel according to an exemplary embodiment.

In the present embodiment, it is described that the reflector 120r is disposed between the light blocking layer 123 and the transparent substrate 121, but the present disclosure is not limited thereto. For example, as shown in FIG. 3D, the reflector 120r may be disposed between the light blocking layer 123 and the adhesive layer 125. That is, the reflector 120r may be disposed on the light blocking layer 123. A lower surface of the reflector 120r may completely overlap with the light blocking layer 123. For example, the lower surface of the reflector 120r may be located in an area covered by the light blocking layer 123, and thus, it is possible to prevent the reflector 120r from being observed from the surface of the substrate 121. The inner and outer surfaces of the reflector 120r may be parallel to sidewalls of the windows 123a, 123b, and 123c of the light blocking layer 123. In another embodiment, a portion of the reflector 120r may be disposed within the windows 123a, 123b, and 123c of the light blocking layer 123.

The reflector 120r may be disposed not to overlap the light emitting elements 10a, 10b, and 10c, but the present disclosure is not limited thereto. For example, at least one of the light emitting elements 10a, 10b, and 10c may partially overlap with the reflector 120r.

When the reflector 120r is disposed between the light blocking layer 123 and the adhesive layer 125, it is possible to reduce loss of light emitted from the light emitting devices 10a, 10b, and 10c due to the light blocking layer 123. Further, when the first to fourth connection layers 129a, 129b, 129c, and 129d include a reflective metallic layer, the first to fourth connection layers 129a, 129b, 129c, and 129d and the reflector 120r are disposed on both upper and lower sides of the light emitting devices 10a, 10b, and 10c to increase the optical efficiency of light generated by the light emitting devices 10a, 10b, and 10c.

Figure 4A:
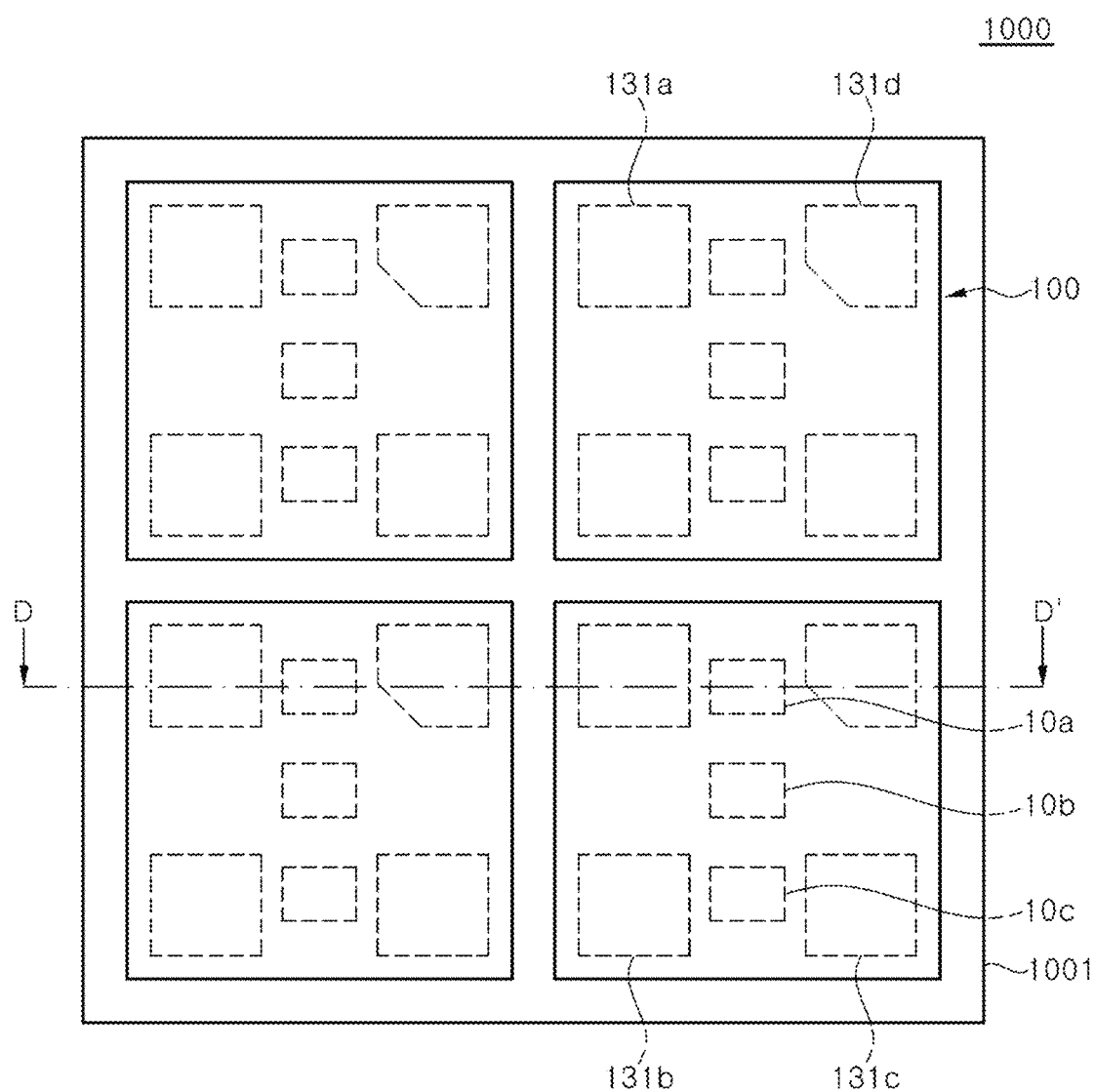
FIG. 4A is a schematic plan view illustrating a pixel module according to an exemplary embodiment.
Figure 4B:
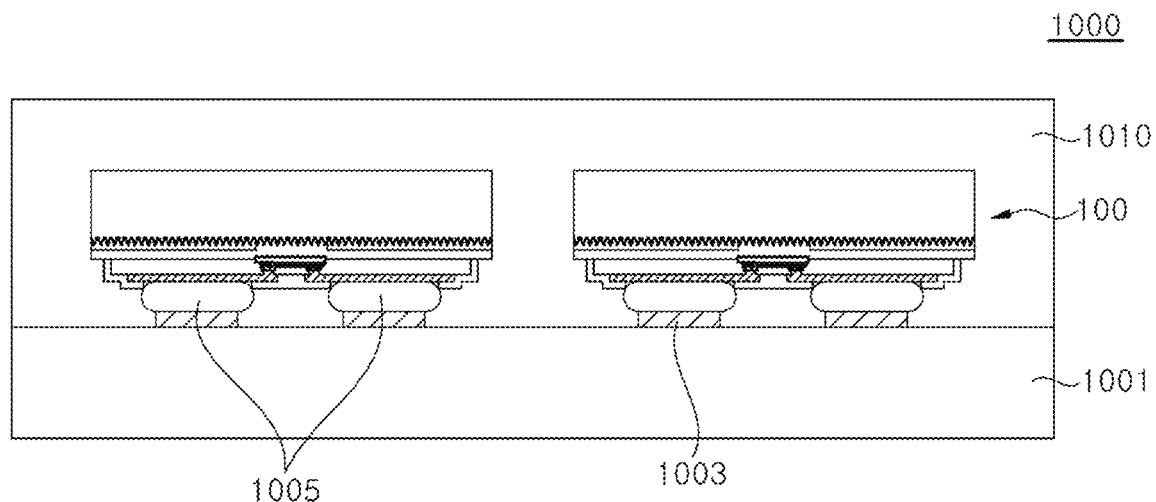
FIG. 4B is a schematic cross-sectional view taken along line D-D' of FIG. 4A.
Figure 4C:
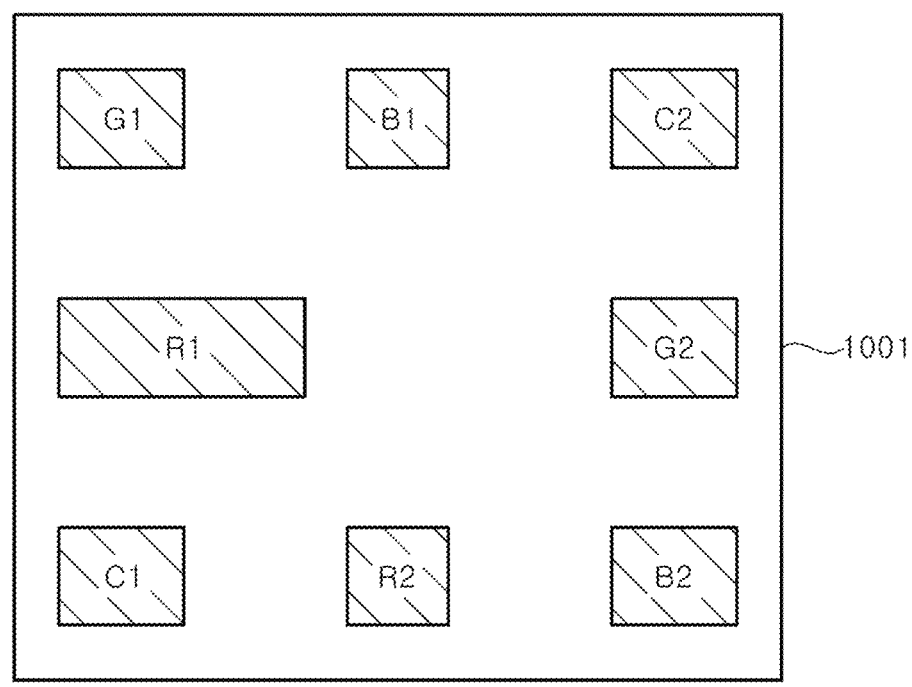
FIG. 4C is a schematic rear view illustrating a pixel module according to an exemplary embodiment.
Figure 4D:
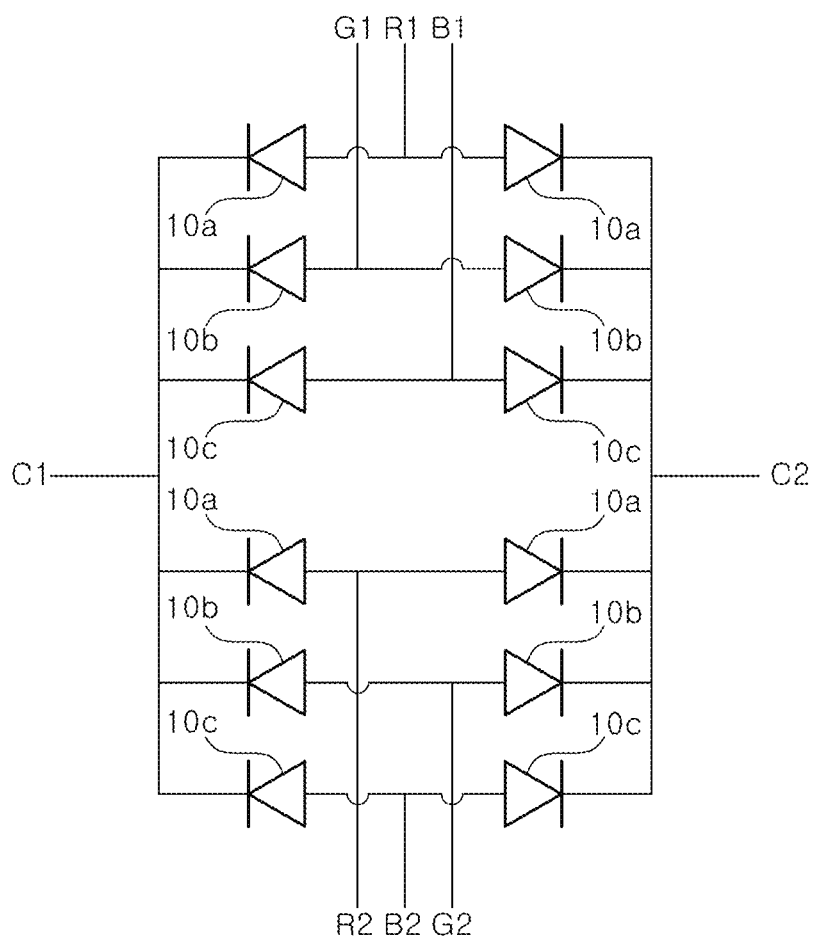
FIG. 4D is a schematic circuit diagram illustrating a pixel module according to an exemplary embodiment.

FIG. 4A is a schematic plan view illustrating a pixel module 1000 according to an exemplary embodiment, FIG. 4B is a schematic cross-sectional view taken along line D-D' of FIG. 4A, FIG. 4C is a schematic rear view illustrating the pixel module 1000 according to an exemplary embodiment, and FIG. 4D is a schematic circuit diagram illustrating the pixel module 1000 according to an exemplary embodiment.

Referring to FIGS. 4A and 4B, the pixel module 1000 includes a circuit board 1001 and unit pixels 100 arranged on the circuit board 1001. Furthermore, the pixel module 1000 may further include a cover layer 1010 covering the unit pixels 100.

The circuit board 1001 may have a circuit for electrically connecting a panel substrate 2100 and the light emitting devices 10a, 10b, and 10c. A circuit in the circuit board 1001 may be formed in a multi-layered structure. The circuit board 1001 may also include a passive circuit for driving the light emitting devices 10a, 10b, and 10c in a passive matrix driving manner or an active circuit for driving them in an active matrix driving manner. The circuit board 1001 may include pads 1003 exposed on a surface thereof.

Since a detailed configuration of the unit pixels 100 is the same as that described with reference to FIGS. 3A and 3B, a detailed description thereof is omitted to avoid redundancy. The unit pixels 100 may be arranged on the circuit board 1001. The unit pixels 100 may be arranged in a 2×2 matrix as shown in FIG. 4A, but the inventive concepts are not limited thereto, and may be arranged in various matrices such as 2×3, 3×3, 4×4, 5×5, or the like.

The unit pixels 100 are bonded to the circuit board 1001 by a bonding material 1005. For example, the bonding material 1005 bonds the connection layers 129a, 129b, 129c, and 129d exposed through the openings 131a, 131b, 131c, and 131d of the insulation material layer 131 described with reference to FIGS. 3A and 3B to the pads 1003 on the circuit board 1001. The bonding material 1005 may be, for example, solder, and may bond the unit pixels 100 and the circuit board 1001 through a reflow process after a solder paste is disposed on the pads 1003 using a technique such as screen printing.

According to the illustrated embodiment, the bonding material 1005 having a single structure may be disposed between the connection layers 129a, 129b, 129c, and 129d and the pads 1003, and the bonding material 1005 may directly connect the connection layers 129a, 129b, 129c, and 129d to the pads 1003.

The cover layer 1010 covers a plurality of unit pixels 100. The cover layer 1010 may prevent light interference between the unit pixels 100 to improve contrast of a displaying apparatus.

The cover layer 1010 may be formed of, for example, dry-film type solder resist (DFSR), photoimageable solder resist (PSR), black material (BM), epoxy molding compound (EMC), or the like. The cover layer 1010 may be formed using, for example, a technique such as lamination, spin coating, slit coating, printing, or the like.

A displaying apparatus 10000 may be provided by mounting the pixel modules 1000 shown in FIGS. 4A and 4B on the panel substrate 2100 of FIG. 1. The circuit board 1001 has bottom pads connected to the pads 1003. The bottom pads may be arranged in a one-to-one correspondence with the pads 1003, but the number of the bottom pads may be reduced through a common connection. In this regard, the pixel module 1000 having the unit pixels 100 arranged in a 2×2 matrix will be exemplarily described with reference to FIGS. 4C and 4D.

FIG. 4C shows the rear view of the pixel module 1000, in which bottom pads C1, C2, R1, R2, G1, G2, B1 and B2 of the circuit board 1001 are illustrated. Since the pixel modules 1000 are arranged in a 2×2 matrix, a total of four pixel modules are arranged on the circuit board 1001. In addition, three light emitting devices 10a, 10b, and 10c are disposed on each pixel module 1000, and four pad regions are disposed. Accordingly, sixteen pads 1003 corresponding to the pad regions of the four unit pixels 100 will be provided on the circuit board 1001. However, only eight bottom pads may be disposed, and the eight bottom pads may be connected to the panel substrate 2100 to individually drive each of the light emitting devices 10a, 10b, and 10c.

FIG. 4D shows the schematic circuit diagram in which each of the light emitting devices 10a, 10b, and 10c is connected to the bottom pads C1, C2, R1, R2, G1, G2, B1, and B2 according to an exemplary embodiment.

Referring to FIG. 4D, the bottom pad C1 is commonly connected to cathodes of the light emitting devices 10a, 10b, and 10c disposed in the left column, and the bottom pad C2 is commonly connected to cathodes of the light emitting devices 10a, 10b, and 10c disposed in the right column.

Meanwhile, in the unit pixels 100 arranged in the upper row, the bottom pad R1 may be connected to anodes of the first light emitting devices 10a, the bottom pad G1 may be connected to anodes of the second light emitting devices 10b, and the bottom pad B1 may be connected to anodes of the third light emitting devices 10c.

Further, in the unit pixels 100 arranged in the lower row, the bottom pad R2 may be connected to the anodes of the first light emitting devices 10a, the bottom pad G2 may be connected to the anodes of the second light emitting devices 10b, and the bottom pad B2 may be connected to the anodes of the third light emitting devices 10c.

Herein, the bottom pads R1, G1, B1, R2, G2, and B2 represent pads connected to red, green, and blue light emitting devices, respectively. However, the order of arrangement of the red, green, and blue light emitting devices may be changed, and, accordingly, locations to which the bottom pads R1, G1, B1, R2, G2, and B2 are connected may also be changed. For example, the circuit diagram of FIG. 4D shows the bottom pads in the assumption that the first light emitting devices 10a are red light emitting devices, the second light emitting devices 10b are green light emitting devices, and the third light emitting devices 10c are blue light emitting devices. Alternatively, the first light emitting devices 10a may be the blue light emitting devices, and the third light emitting devices 10c may be the red light emitting devices, and, in this case, the locations of the bottom pads R1 and R2 and the bottom pads B1 and B2 may be interchanged.

According to the illustrated exemplary embodiment, since the bottom pads C1 and C2 are commonly connected to the cathodes of the light emitting devices in each column, and each of the bottom pads R1, G1, B1, R2, B2, and G2 is commonly connected to the anodes of the two light emitting devices, each of the light emitting devices 10a, 10b, and 10c may be driven independently while reducing the total number of the bottom pads.

Figure 4E:
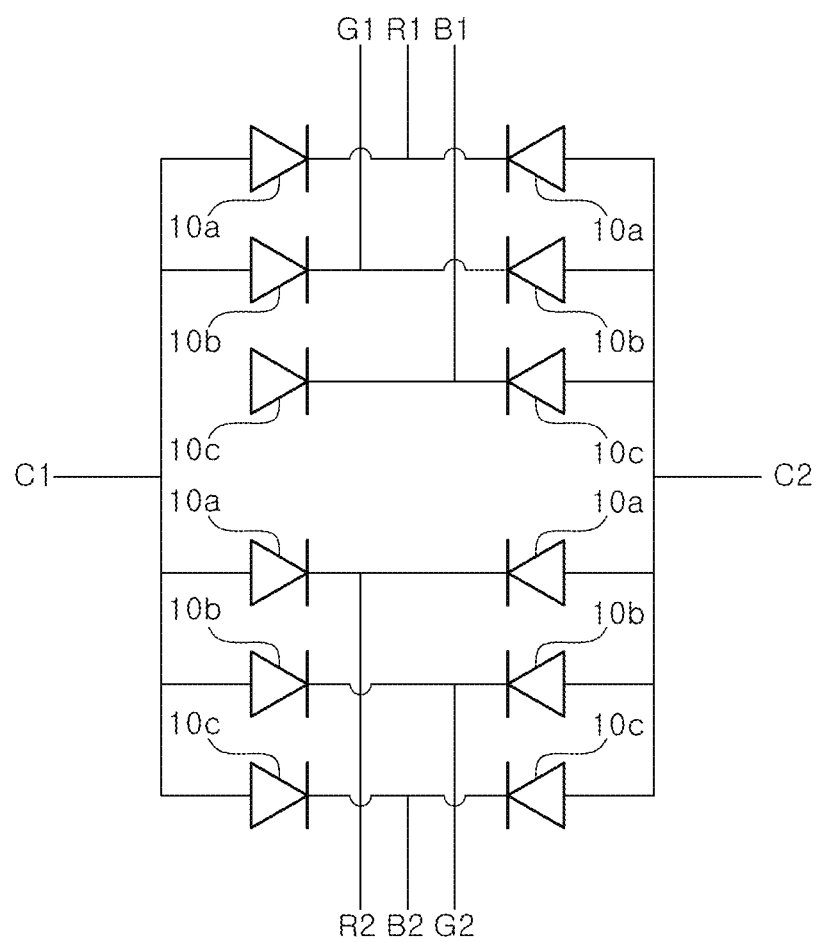
FIG. 4E is a schematic circuit diagram illustrating a pixel module according to another exemplary embodiment.

Although it has been described and illustrated that the bottom pads C1 and C2 are connected to the cathodes of the light emitting devices and the bottom pads R1, G1, B1, R2, B2, and G2 are connected to the anodes of the light emitting devices in the illustrated exemplary embodiment, the bottom pads C1 and C2 may be connected to the anodes of the light emitting devices, and the bottom pads R1, G1, B1, R2, B2 and G2 may be connected to the cathodes of the light emitting devices as shown in FIG. 4E.

Herein, although the pixel module 1000 has been described that the unit pixels 100 are arranged in a 2×2 matrix, the number of the bottom pads may be reduced using a common connection circuit even when the unit pixels 100 are arranged in another matrix such as 3×3, 5×5, or the like.

The light emitting devices 10a, 10b, and 10c in the pixel module 1000 may be individually driven by a driving IC disposed on the panel substrate 2100, and images may be implemented by a plurality of pixel modules 1000.

In the illustrated exemplary embodiment, the displaying apparatus is provided as the unit pixels 100 are formed into the pixel module 1000, and the pixel modules 1000 are mounted on the panel substrate 2100, and thus, a process yield of the displaying apparatus may be improved. However, the inventive concepts are not limited thereto, and the unit pixels 100 may be directly mounted on the panel substrate 2100.

FIGS. 5A through 5F are schematic cross-sectional views illustrating a method of fabricating a unit pixel 100 according to an exemplary embodiment.

Figure 5A:
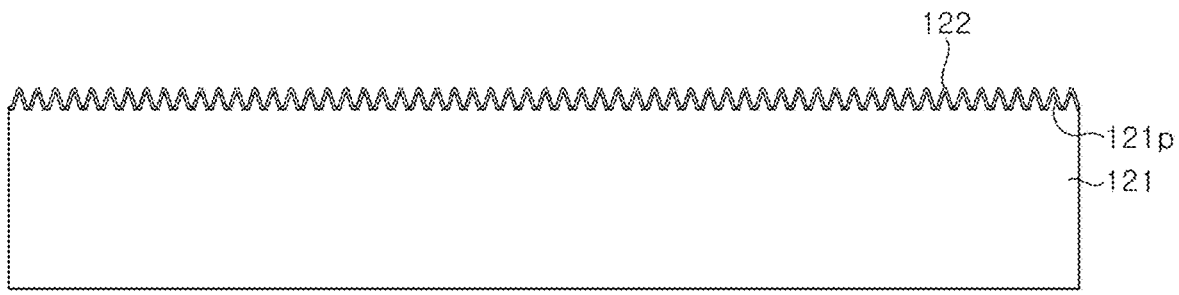
FIGS. 5A through 5F are schematic cross-sectional views illustrating a method of fabricating a unit pixel according to an exemplary embodiment, where.

First, referring to FIG. 5A, an concave-convex pattern 121p is formed on an upper surface of a transparent substrate 121. The transparent substrate 121 is a light-transmitting substrate such as PET, glass substrate, quartz, sapphire substrate, or the like. In an exemplary embodiment, the concave-convex pattern 121p may be formed by etching the surface of the transparent substrate 121 using a dry or wet etching technique.

A surface layer 122 may be formed on the transparent substrate 121 and configured to improve adhesion between the transparent substrate 121 and the light blocking layer 123 and the adhesive layer 125 disposed above the transparent substrate 121. The surface layer 122 may be formed along the concave-convex pattern 121p. The surface layer 122 may be formed of, for example, a silicon oxide film. The surface layer 122 is formed to modify the surface of the transparent substrate 121, and may be omitted.

Figure 5B:
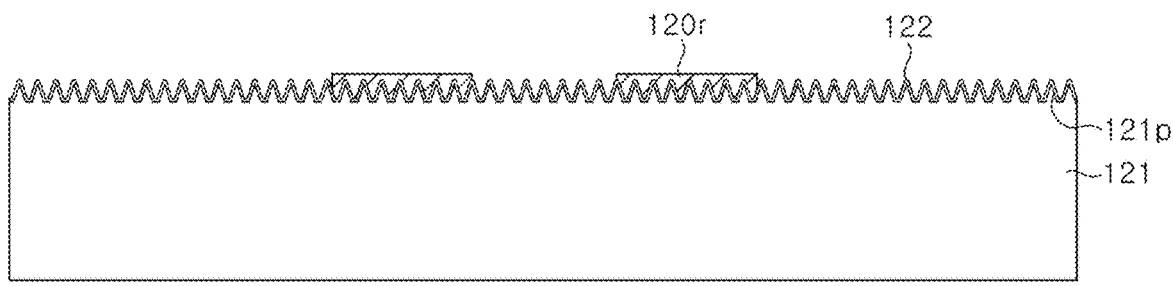

Referring to FIGS. 3A and 5B, a reflector 120r is formed on the transparent substrate 121. The reflector 120r may be formed on the surface layer 122. The reflector 120r may have a circular shape on an outer side thereof as shown in FIG. 3A, and may have a cavity on an inner side thereof for transmitting light generated in the light emitting device 10b. The reflector 120r may be formed using a reflective metal layer through a lift-off technique or the like.

Figure 5C:
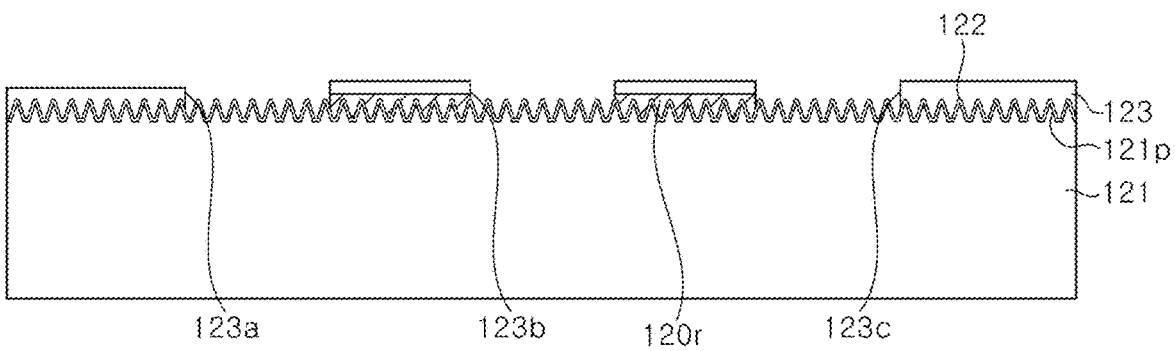

Referring to FIG. 3A and FIG. 5C, a light blocking layer 123 covering the reflector 120r is formed. The light blocking layer 123 may be formed of a light-absorbing material layer, for example, a black matrix including a light-absorbing material such as carbon black. The light blocking layer 123 may also be formed of a photosensitive material layer and patterned through exposure and development techniques. Windows 123a, 123b, and 123c may be formed by patterning the light blocking layer 123. A plurality of windows 123a, 123b, and 123c may be formed corresponding to light emitting devices 10a, 10b, and 10c, and these windows 123a, 123b, and 123c may be spaced apart from one another.

Figure 5D:
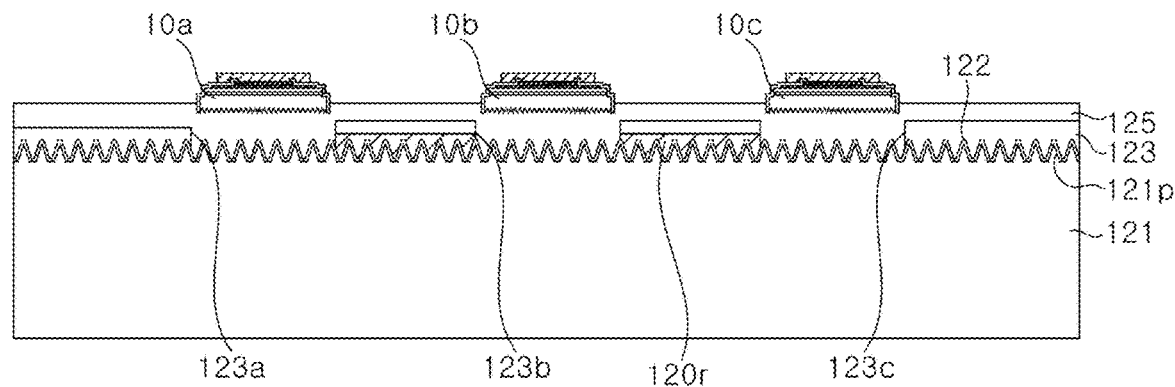

Referring to FIG. 3A and FIG. 5D, an adhesive layer 125 may be formed on the light blocking layer 123. The adhesive layer 125 may cover the light blocking layer 123, and may also cover the surface layer 122 or the transparent substrate 121 exposed through the windows 123a, 123b, and 123c formed on the light blocking layer 123.

The adhesive layer 125 may be formed on an entire surface of the transparent substrate 121, but the inventive concepts are not limited thereto, and may be formed in a portion of the transparent substrate 121 to expose a region near an edge of the transparent substrate 121. The adhesive layer 125 is used to attach the light emitting devices 10a, 10b, and 10c to the transparent substrate 121. The adhesive layer 125 may be formed as a light-transmitting layer, and transmits light emitted from the light emitting devices 10a, 10b, and 10c. The adhesive layer 125 may be formed using an adhesive sheet or an organic adhesive. For example, the adhesive layer 125 may be formed using a transparent epoxy. In an exemplary embodiment, the adhesive layer 125 may include a diffuser such as $SiO_2$, $TiO_2$, ZnO, or the like to diffuse light. The light diffusing material prevents the light emitting devices 10a, 10b, and 10c from being observed from a light exiting surface.

Subsequently, the light emitting devices 10a, 10b, and 10c are disposed on the adhesive layer 125. The light emitting devices 10a, 10b, and 10c may be transferred to the adhesive layer 125 together using a transferring process. The light emitting devices 10a, 10b, and 10c may be disposed corresponding to the windows 123a, 123b, and 123c, respectively. The light emitting devices 10a, 10b, and 10c may have a size smaller than those of the windows 123a, 123b, and 123c and may be located within upper regions of the windows 123a, 123b, and 123c. In another exemplary embodiment, the light emitting devices 10a, 10b, and 10c may have an area larger than those of the windows 123a, 123b, and 123c.

Figure 5E:
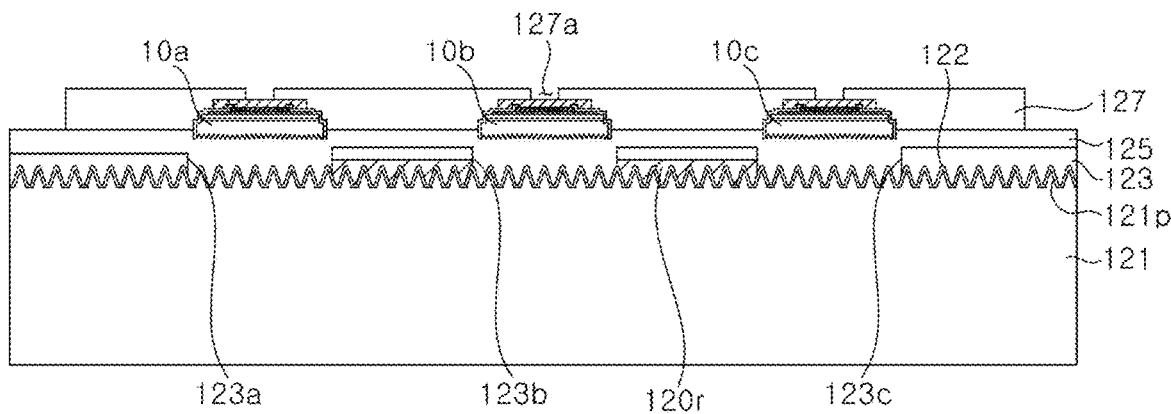

Referring to FIGS. 3A and 5E, a step adjustment layer 127 is formed to cover the light emitting devices 10a, 10b, and 10c. The step adjustment layer 127 may be formed of, for example, photosensitive polyimide, and may be patterned using exposure and development techniques.

For example, the step adjustment layer 127 may have openings 127a exposing the light emitting devices 10a, 10b, and 10c. For example, the openings 127a of the step adjustment layer 127 may expose first and second electrode pads 61 and 63 of FIG. 2B. Furthermore, the step adjustment layer 127 may be removed along an edge of the transparent substrate 121 to expose the adhesive layer 125.

Figure 5F:
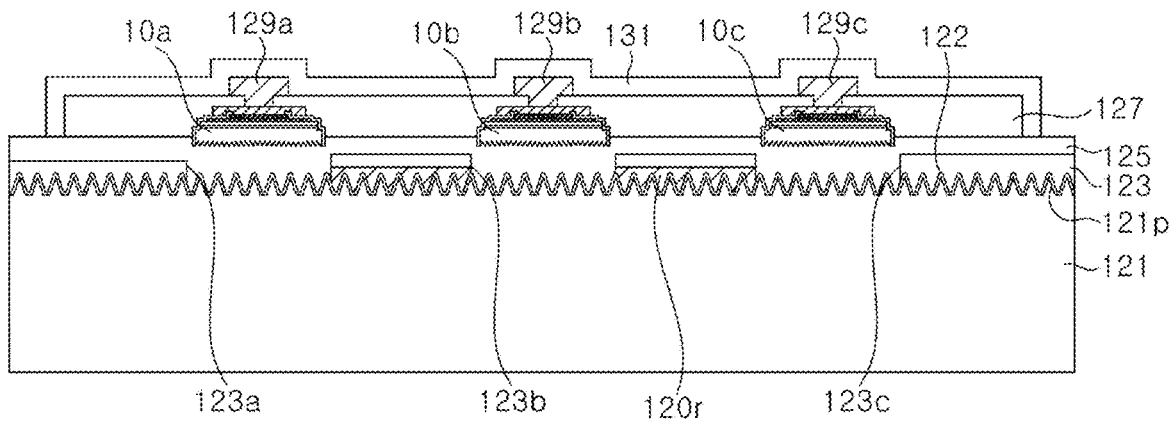

Referring to FIG. 3A and FIG. 5F, first, second, third, and fourth connection layers 129a, 129b, 129c, and 129d are formed on the step adjustment layer 127. For example, the first, second, third, and fourth connection layers 129a, 129b, 129c, and 129d may be formed using a lift-off technique.

The first, second, third, and fourth connection layers 129a, 129b, 129c, and 129d may be electrically connected to the light emitting devices 10a, 10b, and 10c through the openings 127a of the step adjustment layer 127. For example, the first, second, and third connection layers 129a, 129b, and 129c may be electrically connected to first conductivity type semiconductor layers of the light emitting devices 10a, 10b, and 10c, respectively, and the fourth connection layer 129d may be commonly electrically connected second conductivity type semiconductor layers of the light emitting devices 10a, 10b, and 10c.

Subsequently, an insulation material layer 131 may be formed. The insulation material layer 131 covers the first, second, third, and fourth connection layers 129a, 129b, 129c, and 129d. As shown in FIG. 3A, the insulation material layer 131 may have openings 131a, 131b, 131c, and 131d exposing the first, second, third, and fourth connection layers 129a, 129b, 129c, and 129d, and a pad region may be defined by these openings 131a 131b, 131c, and 131d.

According to the exemplary embodiments of the present disclosure, since the reflector 120r is disposed between the light blocking layer 123 and the transparent substrate 121, luminance of light generated in the light emitting devices 10a, 10b, and 10c and emitted from the unit pixel 100 may be increased, and viewing angles may also be adjusted. The reflector 120r may be disposed in a circular shape, but the inventive concepts are not limited thereto, and may be modified into various shapes to adjust the luminance and the viewing angles of light emitted from the light emitting devices 10a, 10b, and 10c. Hereinafter, various modifications of the reflector will be described below.

FIGS. 6A through 6F are schematic plan views illustrating various modifications of a unit pixel according to an exemplary embodiment.

Referring to FIG. 6A, a reflector 321r may be disposed around a specific light emitting device, for example, the light emitting device 10b. The reflector 321r may also be limitedly arranged around the light emitting device 10a or the light emitting device 10c. The reflector 321r may be arranged to increase luminance of a specific light emitting device. The reflector 321r may be disposed so that an outer surface thereof has a rectangular shape.

Figure 6B:
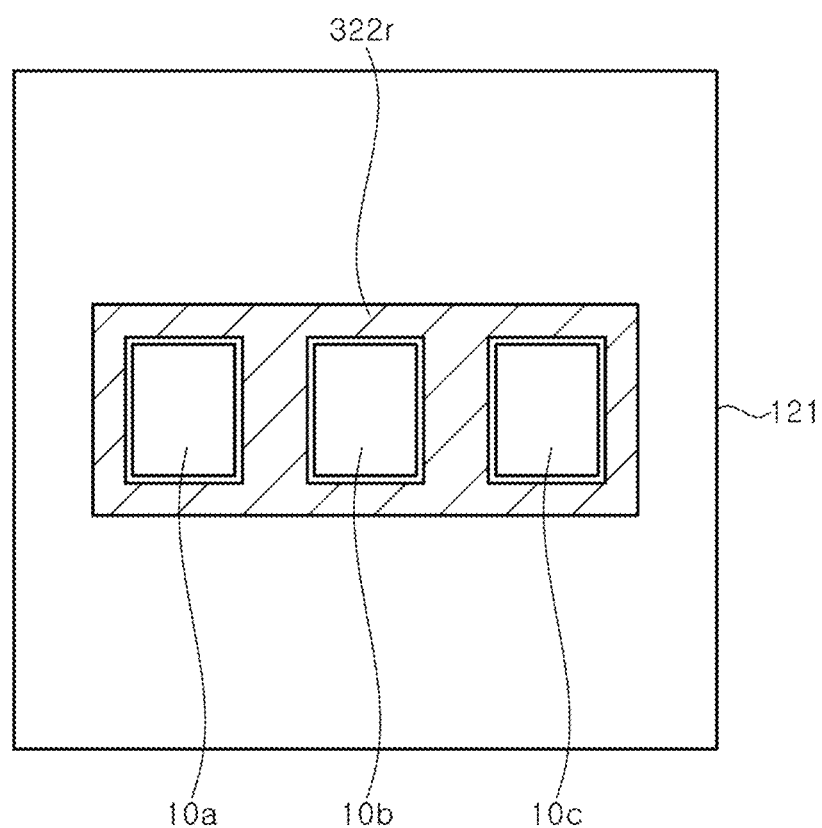

Referring to FIG. 6B, a reflector 322r may be disposed around all of the light emitting devices 10a, 10b, and 10c. All regions between the light emitting devices 10a, 10b, and 10c may be covered with the reflector 322r. The reflector 322r may have a rectangular shape elongated in a lateral direction as a whole. Accordingly, luminance of the light emitting devices 10a, 10b, and 10c may be increased, and viewing angles may be improved.

Figure 6C:
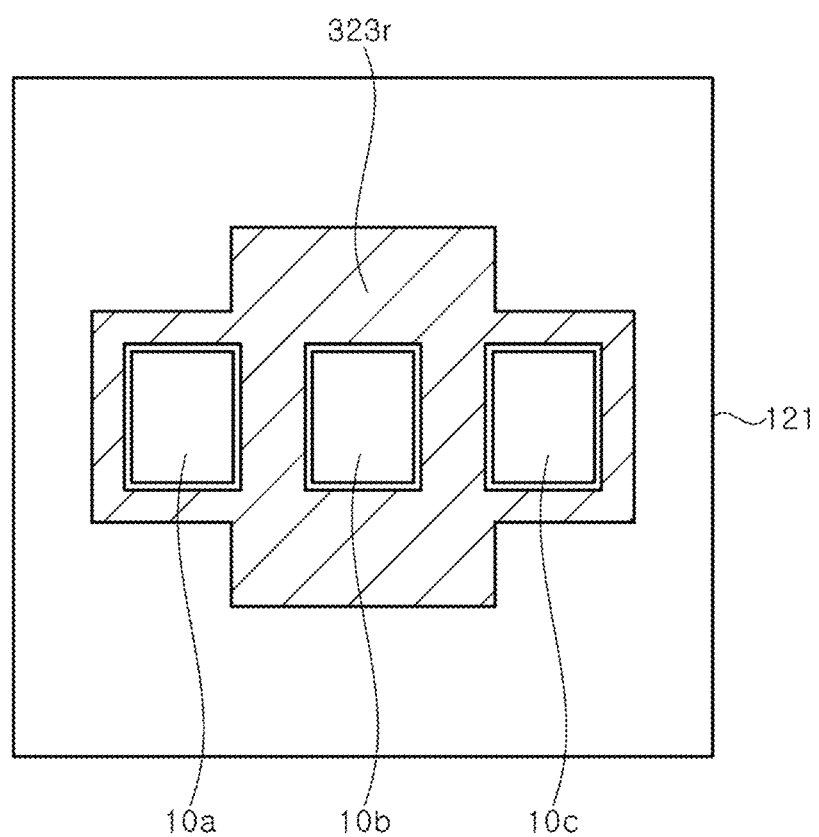

Referring to FIG. 6C, a reflector 323r may be disposed around all of the light emitting devices 10a, 10b, and 10c. Furthermore, a wider area may be included in a central region in a vertical direction than other regions. Accordingly, luminance of the light emitting devices 10a, 10b, and 10c may be increased as a whole, and the vertical viewing angle may be further improved.

Figure 6D:
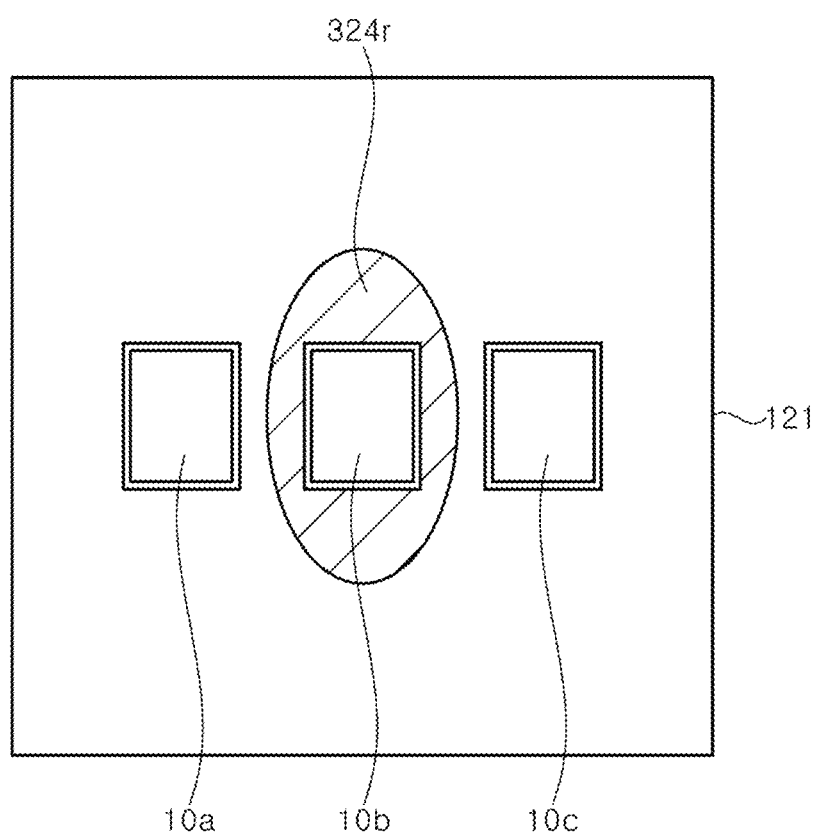

Referring to FIG. 6D, a reflector 324r may be disposed so that an outer surface thereof has an elliptical shape. In particular, the reflector 324r may have an elongated shape in a vertical direction, and thus, luminance of the light emitting device 10b may be increased, and a viewing angle in the vertical direction may be further improved compared to that in horizontal direction.

Herein, although the reflector 324r is illustrated as being disposed around the light emitting device 10b, the reflector 324r may be disposed around the light emitting device 10a or the light emitting device 10c.

Figure 6E:
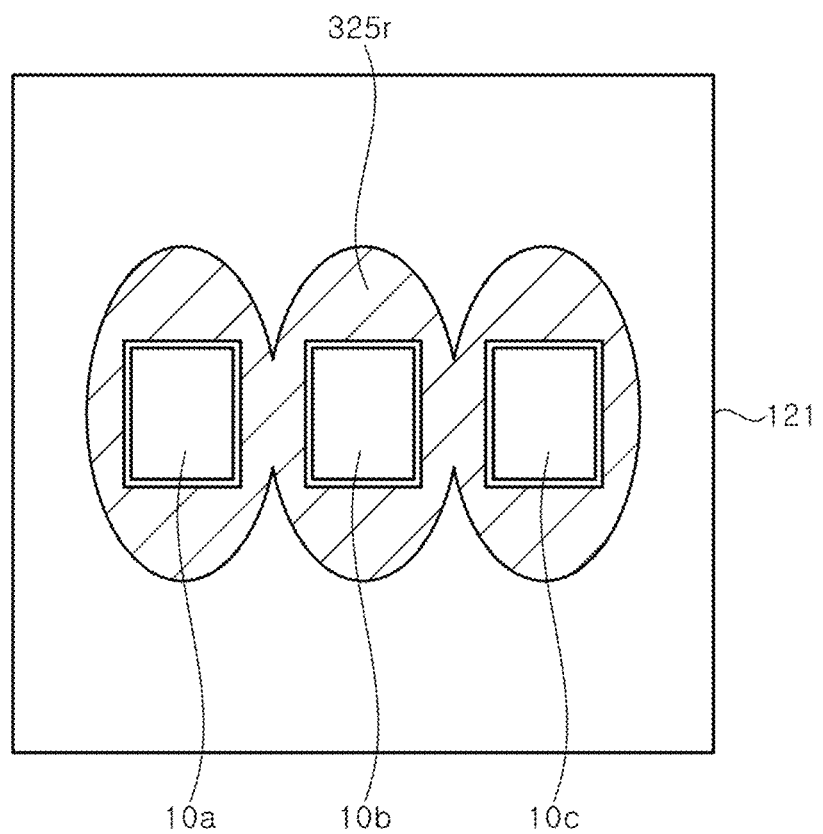

Referring to FIG. 6E, a reflector 325r may be disposed around the light emitting devices 10a, 10b, and 10c all in an elliptical shape. Accordingly, it is possible to improve luminance of each light emitting device and to improve a viewing angle in a vertical direction.

Figure 6F:
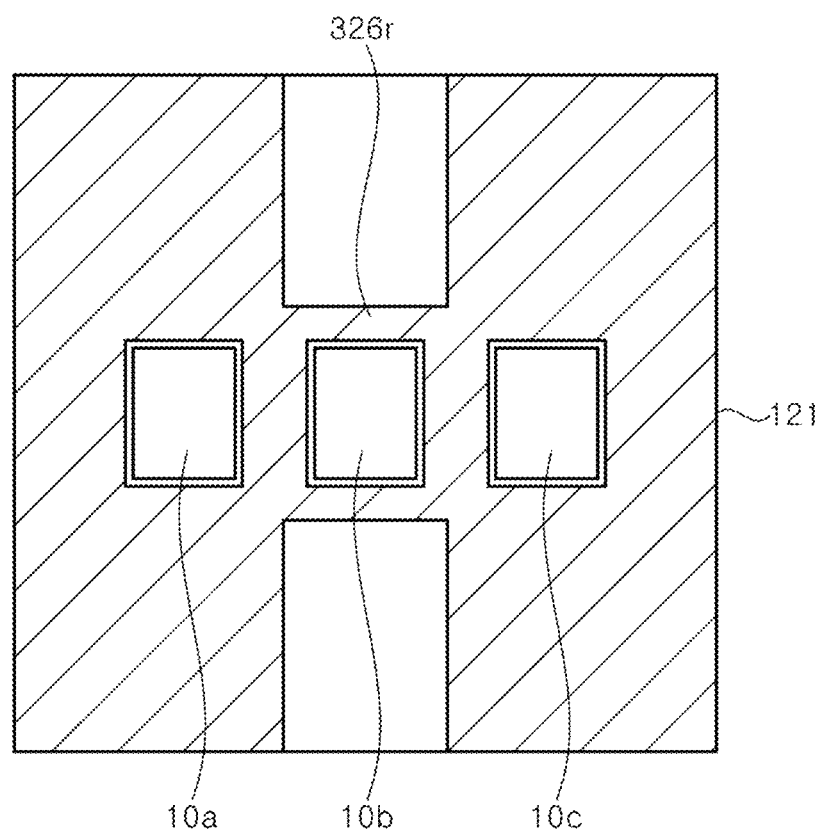

Referring to FIG. 6F, a reflector 326r may be disposed around the light emitting devices 10a, 10b, and 10c. However, the reflector 326r may be disposed wider in a vertical direction around the light emitting devices 10a and 10c than the light emitting device 10b. Accordingly, it is possible to further increase luminance and vertical direction angles of light emitted from the light emitting devices 10a and 10c than light emitted from the light emitting device 10b.

Although some exemplary embodiments have been described herein, it should be understood that these exemplary embodiments are provided for illustration only and are not to be construed in any way as limiting the present disclosure. It should be understood that features or components of one exemplary embodiment can also be applied to other exemplary embodiments without departing from the spirit and scope of the present disclosure.

The invention claimed is:
1. A unit pixel, comprising:
a substrate having a first surface and a second surface;
a plurality of light emitting devices arranged over the first surface of the substrate and including a first light emitting device, a second light emitting device, and a third light emitting device that are configured to emit lights having different peak wavelengths from one another, the second light emitting device disposed between the first light emitting device and the third light emitting device;
a reflector located around the first light emitting device, the second light emitting device, and the third light emitting device,
wherein a region of the reflector disposed around the second light emitting device has an area greater than an area of a region of the reflector disposed around the first light emitting device or the third light emitting device.
2. The unit pixel of claim 1, further comprising:
a light blocking layer disposed between the plurality of light emitting devices and the substrate, and covering the reflector, wherein:
the light blocking layer includes one or more windows through which light generated in the plurality of light emitting devices pass, and
the plurality of light emitting devices are disposed to correspond to the one or more windows.
3. The unit pixel of claim 2, further comprising:
an adhesive layer disposed between the light blocking layer and the plurality of light emitting devices,
wherein the plurality of light emitting devices are attached to the adhesive layer.

4. The unit pixel of claim 3, further comprising:
a surface layer covering a surface of the substrate,
wherein the reflector and the light blocking layer are located on the surface layer.

5. The unit pixel of claim 3, further comprising:
a step adjustment layer covering the plurality of light emitting devices; and
one or more connection layers disposed on the step adjustment layer, wherein:
the step adjustment layer includes a first set of openings exposing the plurality of light emitting devices, and
the one or more connection layers are electrically connected to the plurality of light emitting devices through the first set of openings of the step adjustment layer.

6. The unit pixel of claim 5, further comprising:
an insulation material layer covering the one or more connection layers,
wherein the insulation material layer includes a second set of openings exposing the one or more connection layers.

7. The unit pixel of claim 6,
wherein the insulation material layer covers side surfaces of the step adjustment layer and side surfaces of the one or more connection layers.

8. The unit pixel of claim 7,
wherein the insulation material layer has a thickness smaller than that of the step adjustment layer.

9. The unit pixel of claim 8,
wherein the step adjustment layer and the insulation material layer include polyimide.

10. The unit pixel of claim 5,
each of the plurality of light emitting devices comprising:
a light emitting structure including a first conductivity type semiconductor layer, a second conductivity type semiconductor layer, and an active layer interposed between the first conductivity type semiconductor layer and the second conductivity type semiconductor layer; and
a first electrode pad and a second electrode pad disposed on the light emitting structure,
wherein the first set of openings of the step adjustment layer expose the first electrode pad and the second electrode pad.

11. The unit pixel of claim 10, wherein each of the plurality of light emitting devices further comprises an insulation layer disposed between the light emitting structure and the first electrode pad and the second electrode pad,
wherein the insulation layer includes a distributed Bragg reflector.

12. The unit pixel of claim 11, wherein:
the plurality of light emitting devices include a red light emitting device, a green light emitting device, and a blue light emitting device, and
the insulation layer of the blue light emitting device has a lower reflectance than those of insulation layers of the red light emitting device and the blue light emitting device.

13. The unit pixel of claim 1,
wherein the substrate has a concave-convex pattern on the first surface facing the plurality of light emitting devices.

14. The unit pixel of claim 1, wherein:
the plurality of light emitting devices includes at least three light emitting devices emitting light of different colors from one another, and
the at least three light emitting devices are arranged side by side in a line.

15. A displaying apparatus, comprising:
a circuit board;
a plurality of unit pixels the circuit board; and
each of the plurality of unit pixels comprising:
a substrate having a first surface and a second surface;
a plurality of light emitting devices arranged over the first surface of the substrate and including a first light emitting device, a second light emitting device, and a third light emitting device that are configured to emit lights having different peak wavelengths from one another; and
a reflector located around the first light emitting device,
wherein a region of the reflector disposed around the second light emitting device has an area greater than an area of a region of the reflector disposed around the first light emitting device or the third light emitting device.

16. The displaying apparatus of claim 15, wherein one of the plurality of unit pixels further comprises:
a light blocking layer disposed between the plurality of light emitting devices and the substrate, and covering the reflector, wherein:
the light blocking layer has windows through which light generated in the plurality of light emitting devices pass, and
the plurality of light emitting devices are disposed to correspond to the windows.

17. The displaying apparatus of claim 16, wherein one of the plurality of unit pixels further comprises:
a step adjustment layer covering the plurality of light emitting devices; and
connection layers disposed on the step adjustment layer, wherein:
the step adjustment layer has a first set of openings exposing the plurality of light emitting devices, and
the connection layers are electrically connected to the plurality of light emitting devices through the first set of openings of the step adjustment layer.

18. The displaying apparatus of claim 17, further comprising:
bonding materials configured to bond the connection layers and pads.

19. The displaying apparatus of claim 15,
wherein the reflector is disposed around one or more of the plurality of light emitting devices.

20. The displaying apparatus of claim 15,
wherein the reflector is disposed to cover all regions between the plurality of light emitting devices.

* * * * *